US012585393B2

(12) United States Patent     (10) Patent No.:     US 12,585,393 B2
Patel et al.     (45) Date of Patent:     Mar. 24, 2026

(54) LOW POWER AND AREA OPTIMIZED TM4 AND TM5 COMPLIANT COMBINATION TMIO TRANSMITTER ARCHITECTURE

(71) Applicant: Sandisk Technologies, Inc., Milpitas, CA (US)

(72) Inventors: Niravkumar Natwarbhai Patel, Bangalore (IN); Shiv Harit Mathur, Bangalore (IN); Sumanth Reddy Rathna, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 255 days.

(21) Appl. No.: 18/354,211

(22) Filed: Jul. 18, 2023

(65) Prior Publication Data

US 2024/0220134 A1     Jul. 4, 2024

Related U.S. Application Data

(60) Provisional application No. 63/435,910, filed on Dec. 29, 2022.

(51) Int. Cl.
　　*G11C 11/00*　　　(2006.01)
　　*G06F 3/06*　　　(2006.01)
　　*H03K 19/20*　　　(2006.01)
(52) U.S. Cl.
　　CPC .......... *G06F 3/0625* (2013.01); *G06F 3/0659* (2013.01); *G06F 3/0679* (2013.01); *H03K 19/20* (2013.01)

(58) Field of Classification Search
　　CPC .... G06F 3/0625; G06F 3/0659; G06F 3/0679; H03K 19/20
　　See application file for complete search history.

(56) References Cited

U.S. PATENT DOCUMENTS

2006/0061401 A1*  3/2006  Shiratake ................. G06F 1/10
　　　　　　　　　　　　　　　　　　327/291
2006/0190781 A1*  8/2006  Farmer ............ G01R 31/31727
　　　　　　　　　　　　　　　　　　714/724
2006/0253821 A1*  11/2006  Kitahara ............... G06F 30/396
　　　　　　　　　　　　　　　　　　716/108

OTHER PUBLICATIONS

Open NAND Flash Interface (ONFI) Workgroup, "Open NAND Flash Interface Specification," Revision 5.0, May 25, 2021, 383 pages (https://media-www.micron.com/-/media/client/onfi/specs/onfi_5_0_gold.pdf).

* cited by examiner

*Primary Examiner* — Pho M Luu
(74) *Attorney, Agent, or Firm* — Pearl Cohen Zedek Latzer Baratz LLP

(57) ABSTRACT

A system for altering an input/output (I/O) data signal of a NAND programming operation includes a skew-gen circuit comprising: a delay block coupled to an input of a two input logic OR gate, and a MUX logic gate coupled to an output of the logic OR gate. The skew-gen circuit is configured to: alter the pulse width of a input data signal by increasing the width of the data high signal and decreasing the width of the data low signal; and output the altered data signal to the MUX, the MUX configured to select either the altered data signal or the input data signal depending on the mode.

17 Claims, 25 Drawing Sheets

SB0

LOW POWER AND AREA OPTIMIZED TM4 AND TM5 COMPLIANT COMBINATION TMIO TRANSMITTER ARCHITECTURE

CROSS REFERENCE TO RELATED APPLICATIONS

This application claims the benefit of and priority to U.S. Provisional Patent Application No. 63/435,910, filed on Dec. 29, 2022, the contents of which are incorporated herein by reference in their entirety.

BACKGROUND

Semiconductor memory is widely used in various electronic devices, such as cellular telephones, digital cameras, personal digital assistants, medical electronics, mobile and non-mobile computing devices, vehicles, and so forth. Semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

NAND-type flash memories typically have multiple memory dies or chips controlled by a controller. Each die contains a memory array and peripheral circuits. At any one time, each die may be involved in various memory operations including input/output (I/O) operations with the memory controller. I/O operations are demanding on peripheral circuits. For example, in enterprise SSD (Solid-State Disk) and Client SSD the input/output ("I/O"), there may be 8 to 16 dies stacked on same I/O channel or interface and they may operate at 200 MHz (Double Data Rate 2 Synchronous Dynamic Random-Access Memory (DDR2 SDRAM)) speed with reduced power.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
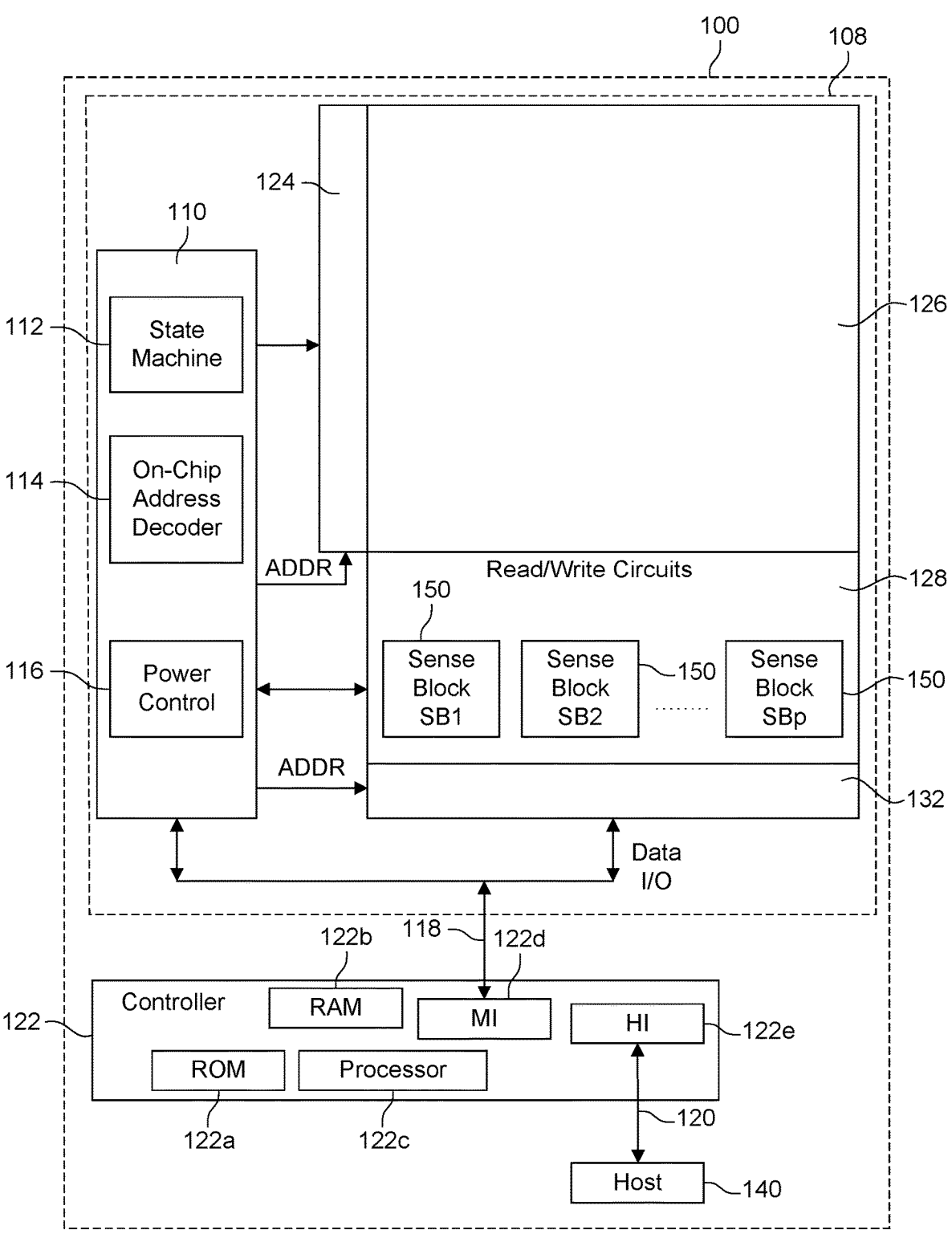
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

NAND memory includes various input (I/O) interface standards for transmission signaling. For example, NAND memory interfaces can include fourth generation standards (Open NAND Flash Interface (ONFI) 4.0) and fifth generation standards (ONFI 5.0). The fourth generation standard introduces the Non-volatile DDR3 (NV-DDR3) data interface. Operation of the NV-DDR3 interface (e.g., NV-DDR3 operation) allows the I/O power (VCCQ) requirement to reach down to 1.2V to support a lower voltage for signaling in a 1.2V controller. The release of ONFI 5.0 specifications added an additional NV-LPDDR4 data interface. Operation of the NV-LPDDR4 interface (e.g., NV-LPDDR4 operation) emphasizes lowering overall power consumption while upscaling the transfer rate of each interface. For example, the ONFI 5.0 standard upscales the transfer rate of the NV-DDR3 and NV-LPDDR4 interfaces to 2400MT/s.

The NV-DDR3 interface uses center tapped terminated (CTT) signaling. To properly conduct CTT signaling, the NV-DDR3 data interface requires a PMOS based pull-up driver. In contrast, NV-LPDDR4 interface I/Os uses low voltage swing terminated logic (LVSTL) signaling for high-speed signaling. NV-LPDDR4 data interfaces can use NMOS pull-up drivers. NV-DDR3 and NV-LPDDR4 data interfaces can use combination PMOS/NMOS pull-up drivers.

Although conventional PMOS based pull-up drivers can be used in NV-Low-Power DDR4 (NV-LPDDR4) operation, they suffer from a variety of deficiencies. For example, during NV-LPDDR4 operation, the PMOS based pull-up driver performance degrades due to an imbalance in output rise and fall in slew-rates since pull-up impedance doubles when compared to ODT impedance. This failure is amplified, and thus especially significant, when a higher load is applied.

The conventional design of a combination PMOS and NMOS pull-up driver used in NV-LPDDR4 operation addresses the deficiencies of the PMOS based pull-up driver during LPDDR4 operation. However, the combination PMOS and NMOS pull-up driver results in an increase in circuit area an increase in capacitance at the I/O pad and an increase in power (e.g., static power and dynamic power). For example, because the combination PMOS and NMOS pull-up driver includes a plurality of NMOS pull-up drivers, the footprint of the circuit is increased. The additional circuit footprint results in decreased circuit performance.

The skew-gen circuit proposed herein allows for a PMOS based-pull up driver to be used in NV-LPDDR4 operation without the need for a plurality of NMOS pull-up drivers. Thus, the skew-gen circuit allows for area and power savings by removing the need to combine PMOS and NMOS pull-up drivers. The skew-gen circuit proposed herein also continues to meet the performance and output requirements of the ONFI specification.

The skew-gen circuit is configured to alter the pulse-width of the input signal and pass skewed signal to sub-sequent blocks (e.g., remaining datapath, pre-driver and driver). The pulse-width of the skewed the signal is altered such that pulse-width of data high signal increases and pulse-width of data low signal reduces for LVSTL signaling. Altering the pulse width of the data high signal alters the ON time of the pull-up driver and pull-down driver during NV-LPDDR4 operation. Thus the increased width of the pulse increases the ON time of the pull-up driver and reduces ON time the pull-down driver for LVSTL signaling.

In one embodiment, the skew-gen circuit includes a plurality of skew-gen circuit components. The plurality of skew-gen circuit components includes a delay block. The input signal is coupled to a first input of the OR/AND gate. The delay block is communicatively coupled to a second input of the two input logic OR/AND gate. The logic OR/AND gate includes an output communicatively coupled to an input of a MUX. The MUX includes a mode input configured to inactivate the skew-gen circuit during NV-DDR3 operation and activate the skew-gen circuit during NV-LPDDR4 operation.

The plurality of skew-gen circuit components are configured to increase the pulse width of the I/O data high signal. Each individual component of the plurality of skew-gen circuit components is configured to alter the pulse width of the data signal (both high and low). For example, the delay block coupled to the second input of the OR gate is configured to skew the data high signal by increasing the pulse duration, which increases the pulse width. The skewed signal is passed to the pull-up and pull-down driver through their respective pre-drivers. The increased pulse width increases the ON time for the pull-up driver and reduces the ON time for pull-down driver.

FIG. 1 is a block diagram of an example non-volatile memory system 100. In one embodiment, the non-volatile memory system 100 is a card-based system, such as a secure digital (SD) or a micro secure digital (micro-SD) card. In an alternate embodiment, memory system 100 is part of an embedded memory system. For example, the flash memory may be embedded within the host. In other examples, memory system 100 can be a solid state drive (SSD). The non-volatile memory system 100 includes one or more non-volatile memory dies 108, and a controller 122. The memory die 108 can be a complete memory die or a partial memory die. As seen here, the memory die 108 includes a memory structure 126, control circuitry 110, and read/write/erase circuits 128. The memory structure 126 is addressable by wordlines via a row decoder 124 and by bitlines via a column decoder 132. The read/write/erase circuits 128 include multiple sense blocks 150 including SB1, SB2, . . . , SBp (hereinafter referred to as sensing circuitry). The read/write/erase circuits 128 and sensing circuitry allow a page of memory cells to be read, programmed, or erased in parallel.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include 2D arrays, 3D arrays, and other memory structures that may have a string configuration. Although current iterations of other memory structure (e.g., MRAM, PCM, and Spin RAM) are configured without a string, memories of these cells can be configured into a topology that has a string, and thus could be utilized in a format that would allow them to be erased in a block format and programmed in chunks. Thus, in this potential configuration, embodiments of the disclosure could be foreseeably applied.

A person of ordinary skill in the art will recognize that the technology described herein is not limited to a single specific memory structure, but covers many relevant memory structures within the spirit and scope of the technology as described herein and as understood by one of ordinary skill in the art.

The control circuitry 110 cooperates with the read/write/erase circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters. The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The controller 122 interfaces with the one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

In one embodiment, a controller 122 is included in the same package (e.g., a removable storage card) as the memory die 108. In other embodiments, the controller is separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via bus lines 118. In one embodiment, memory die 108 includes a set of input and/or output (I/O) pins that connect to bus lines 118.

The controller 122 includes one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein (e.g., non-transitory computer readable storage medium). Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

Figure 2:
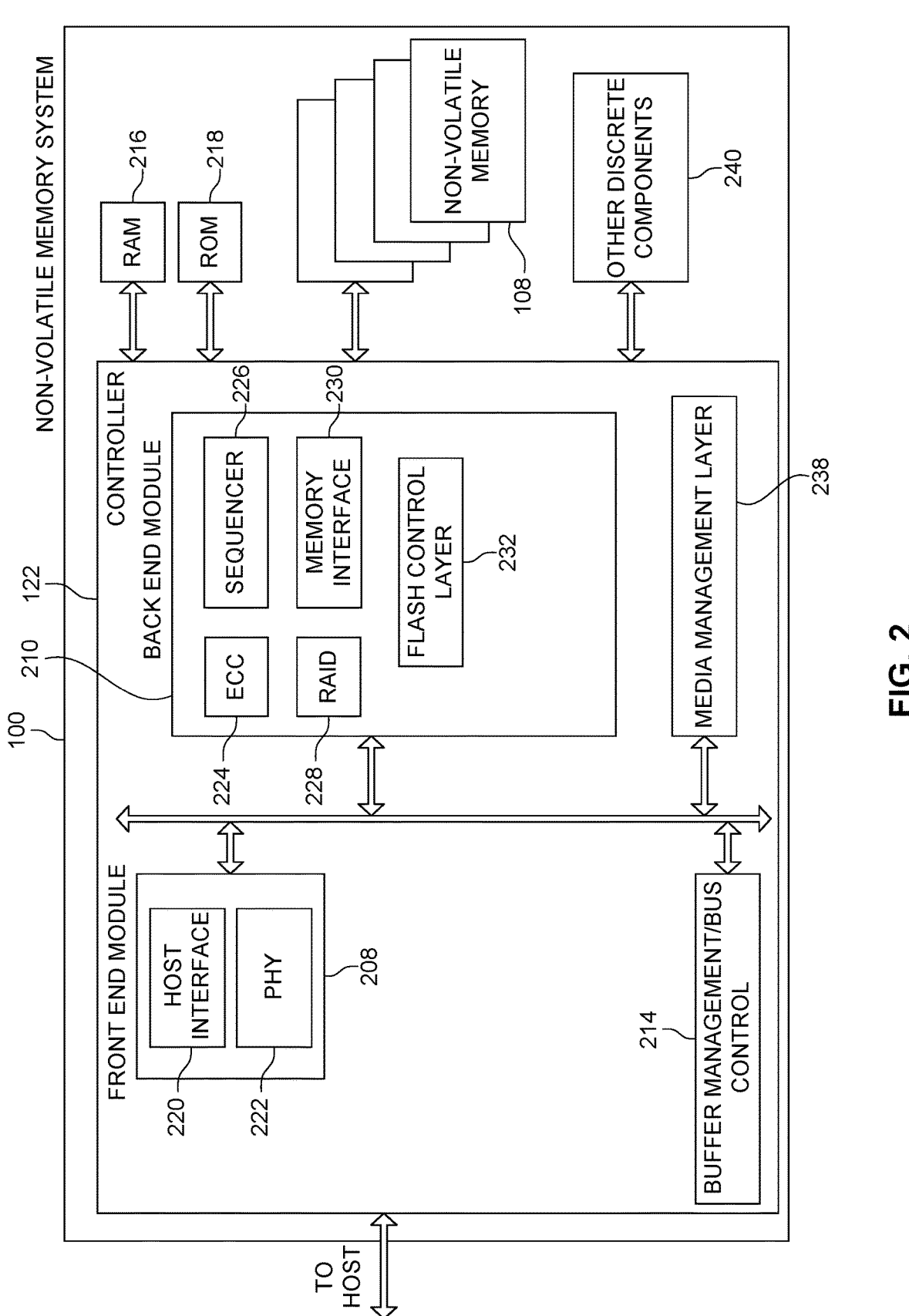
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that the one or more non-volatile memory dies 108 are not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the block can be erased and reused).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fiber Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or greater interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Figure 3:
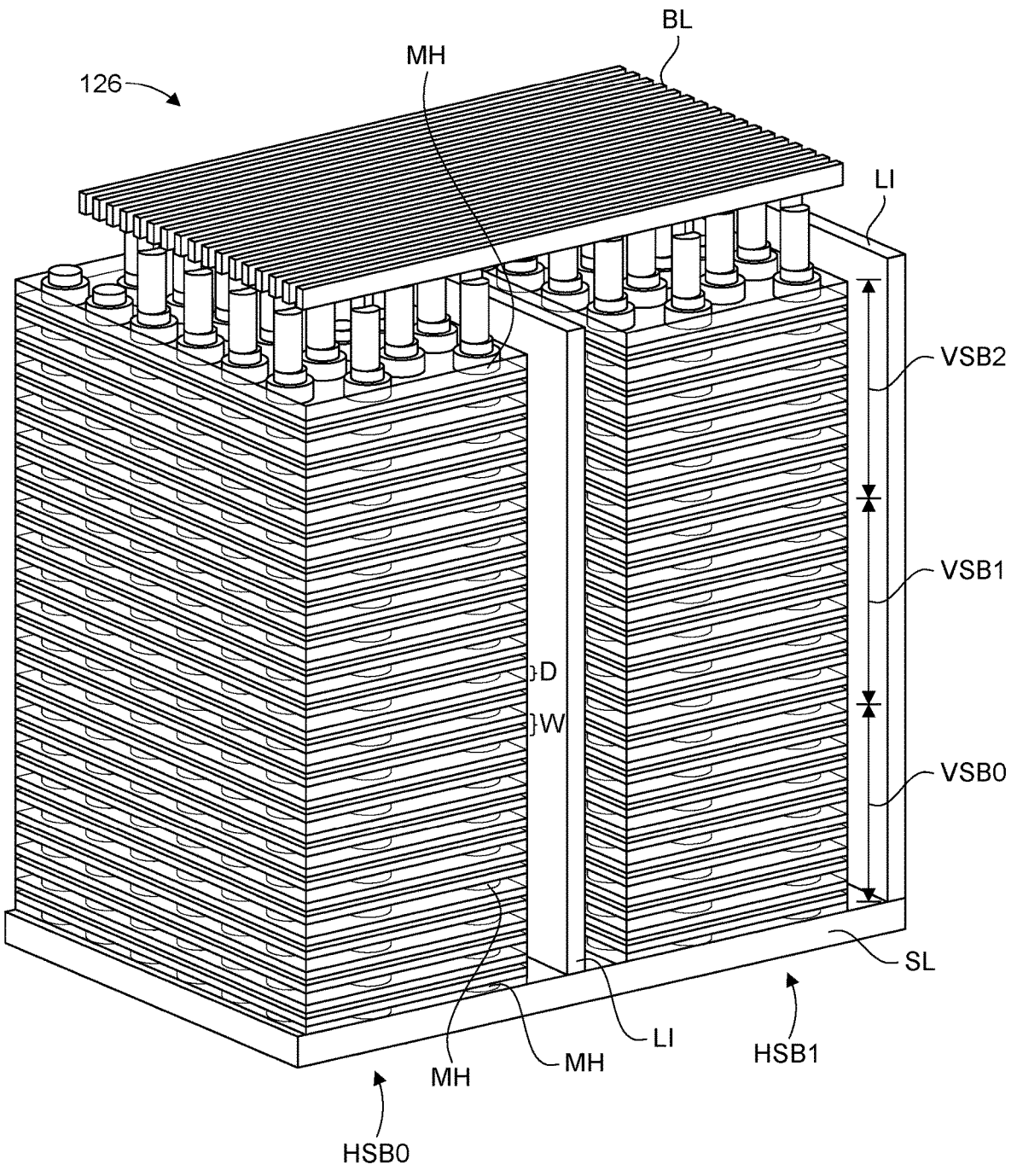
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (i.e., wordline layers) is marked as WL. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating D layers and WL layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2.

Figure 4A:
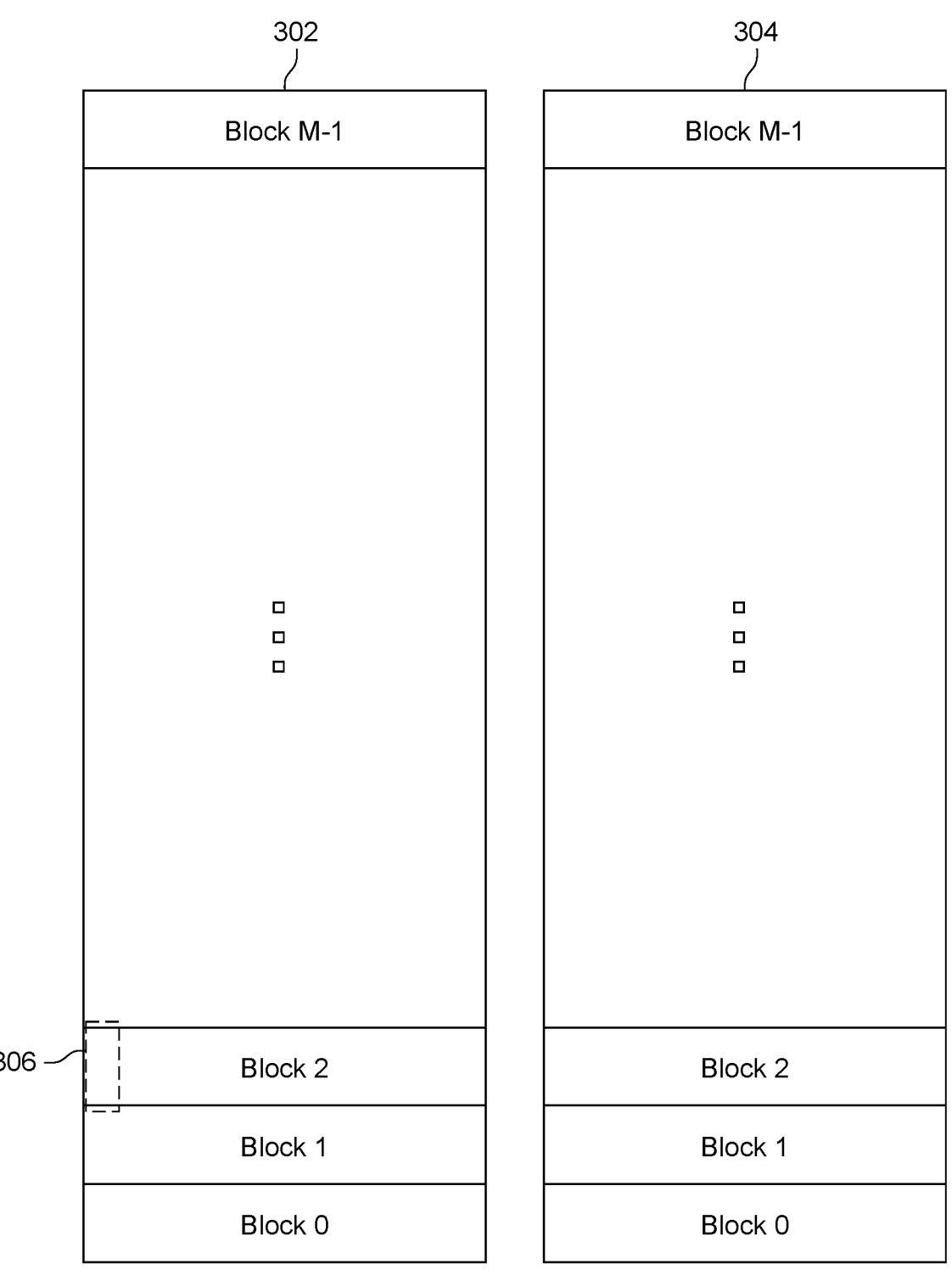
FIG. 4A is a block diagram of an example memory structure having two planes, in connection with which, example embodiments of the disclosed technology can be implemented.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of wordlines.

Figure 4B:
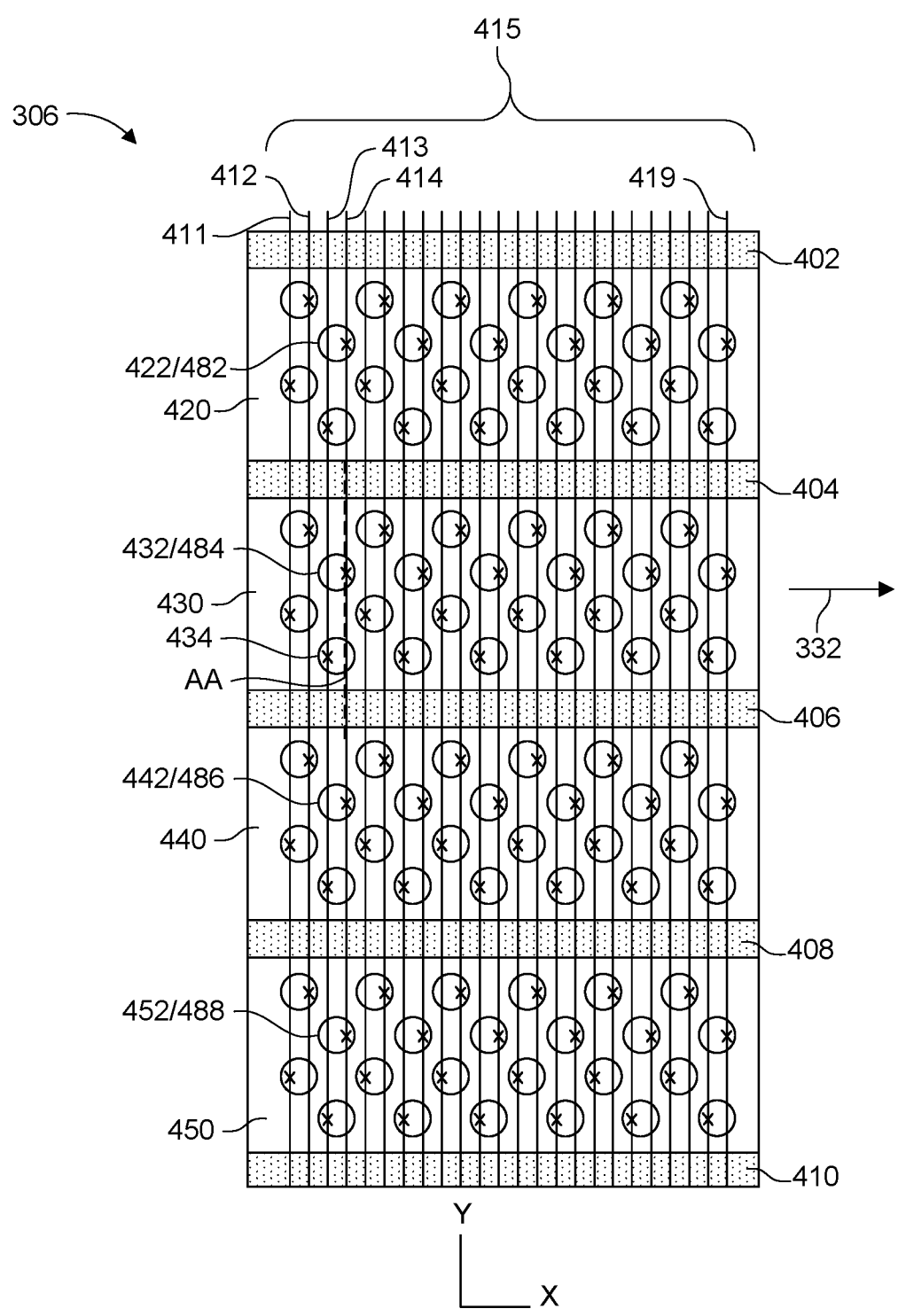
FIG. 4B depicts a top view of a portion of a block of example memory cells, in connection with which, example embodiments of the disclosed technology can be implemented.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of four rows connected to a common bitline are connected to the same wordline (via different wordline fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
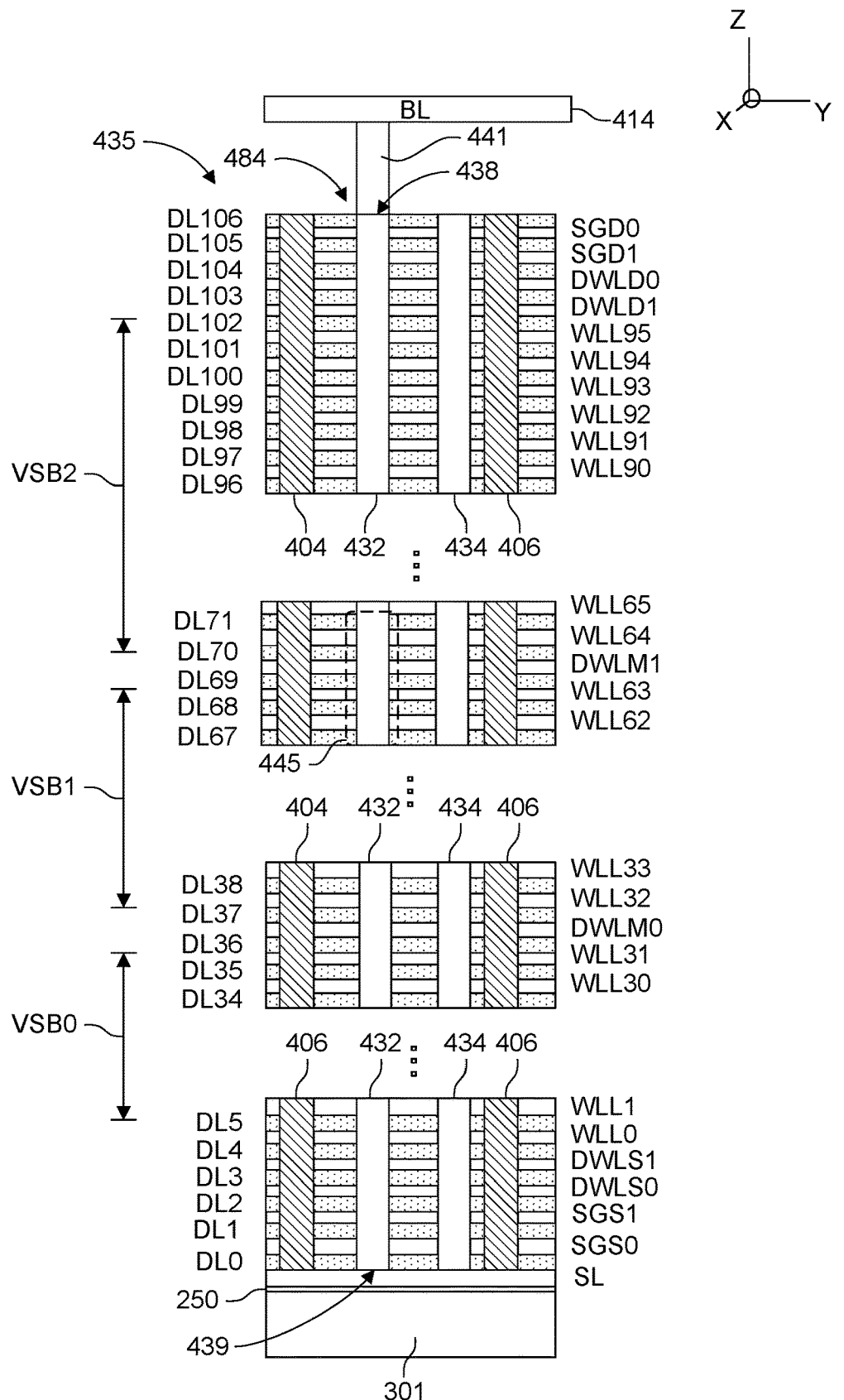
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding with vertical sub-block VSB0 wordlines WLL0-WLL31) from a second set of memory cell transistors within the memory string (e.g., corresponding with the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy wordline layers DWLM in order to divide the stack 435 into the additional vertical sub-blocks. In one embodiment, the stack has two vertical sub-blocks.

Figure 4D:
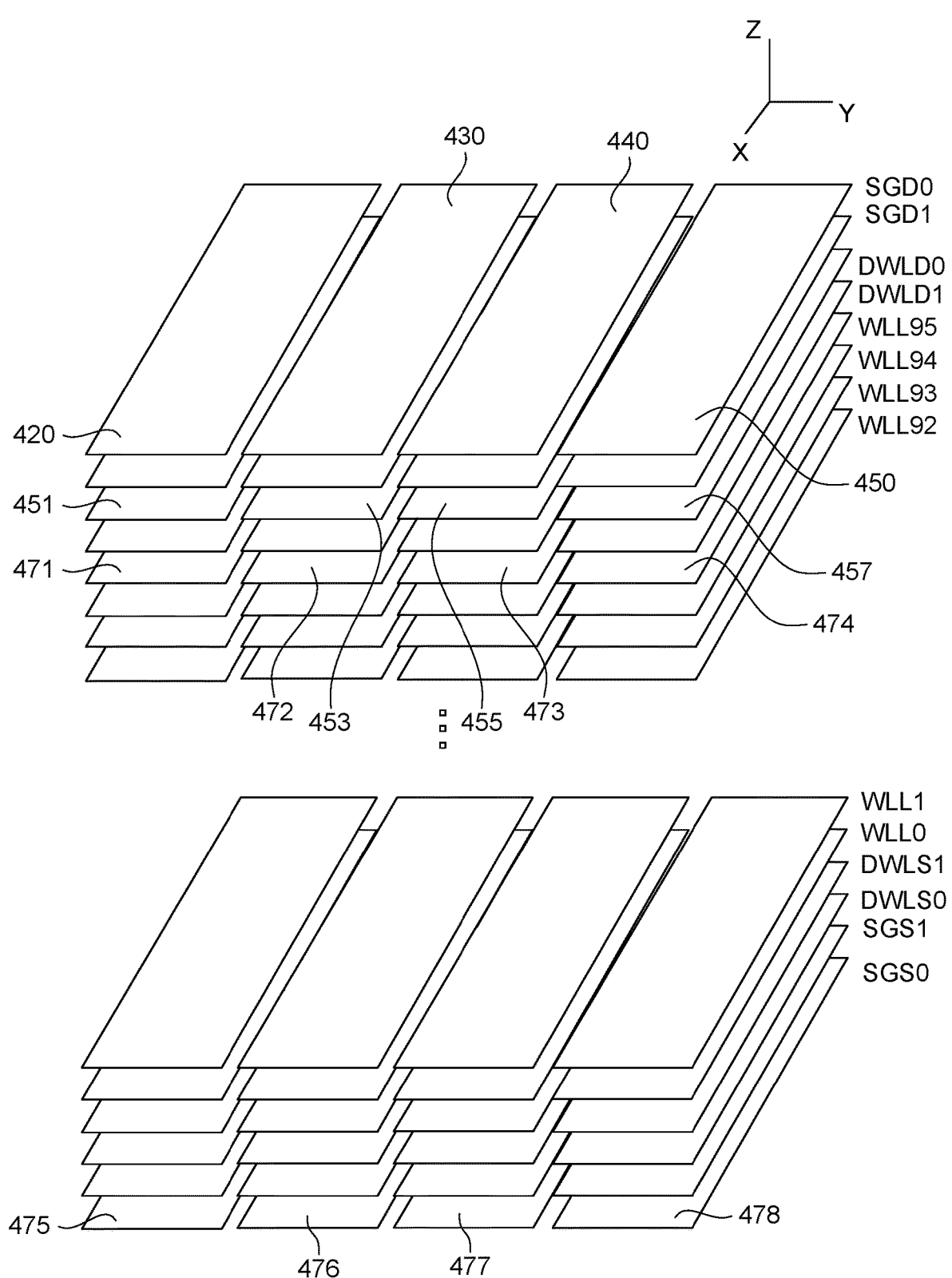
FIG. 4D depicts an alternative view of the select gate layers and wordline layers.

FIG. 4D depicts an alternative view of the SG layers and wordline layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy wordline layers. Each dummy wordline layer represents a wordline, in one approach, and is connected to a set of dummy memory cells at a given height in the stack. For example, DWLD0 comprises wordline layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source-side dummy wordline layers. Below the source-side dummy wordline layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
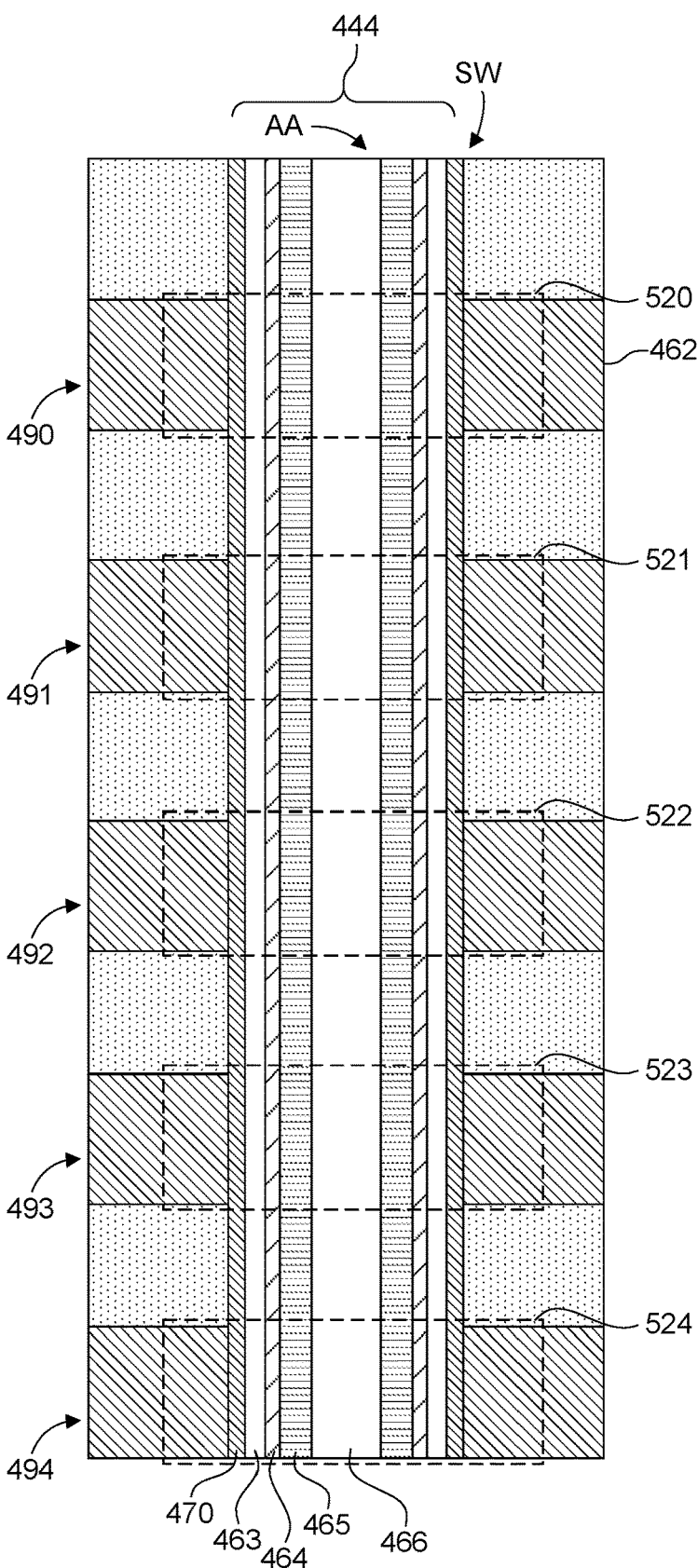
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel. For example, in one embodiment, the erase operation includes removing electrons from the floating gate in order to change the state of the cell to 1. During the erase operation, a large negative voltage is required to repel electrons from the floating gate. This can be accomplished by grounding the control gate and applying a high voltage (e.g., about 18V or more) to the substate. As a result, electrons are removed from the floating gate due to the FN tunneling effect.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
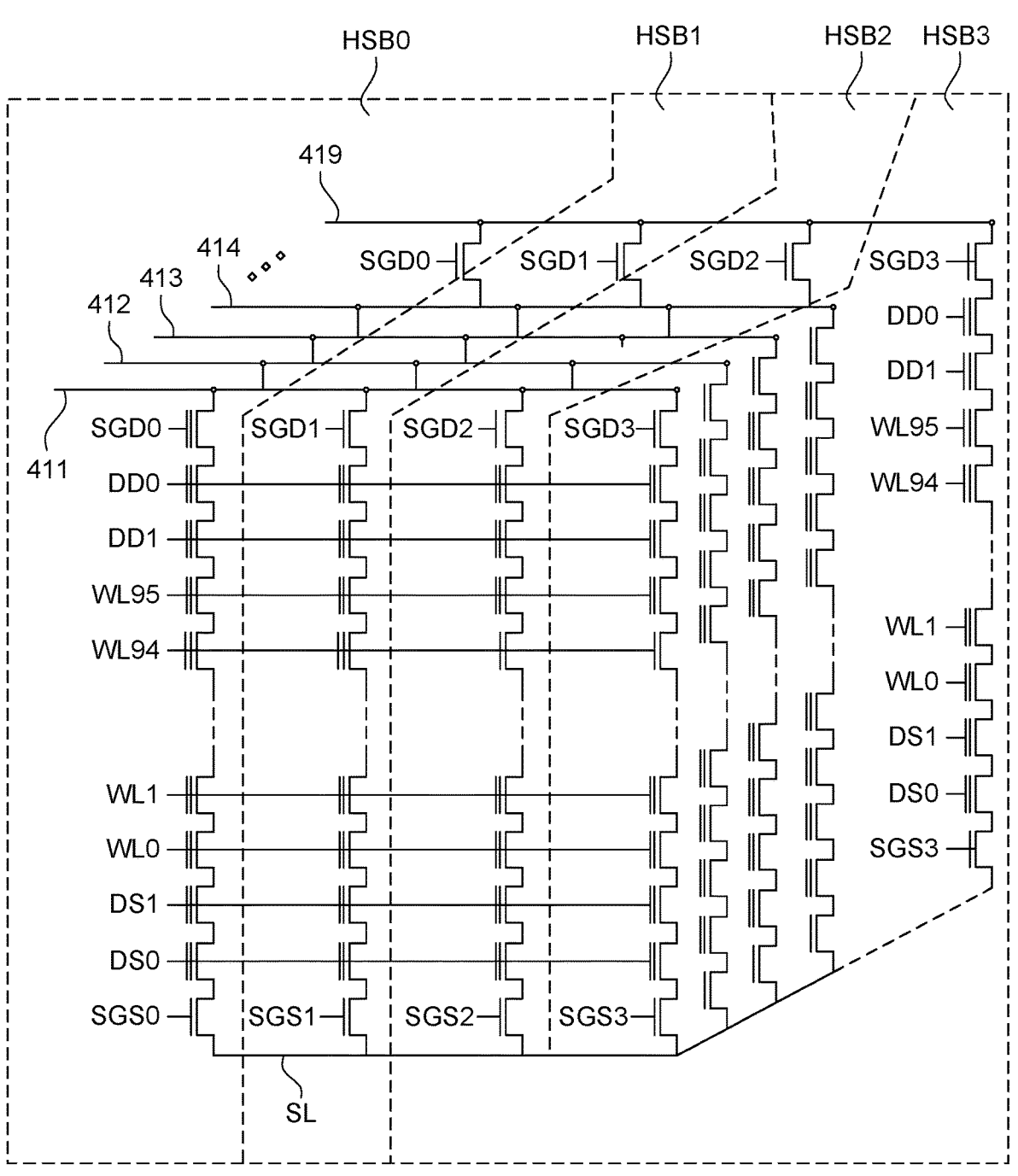
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
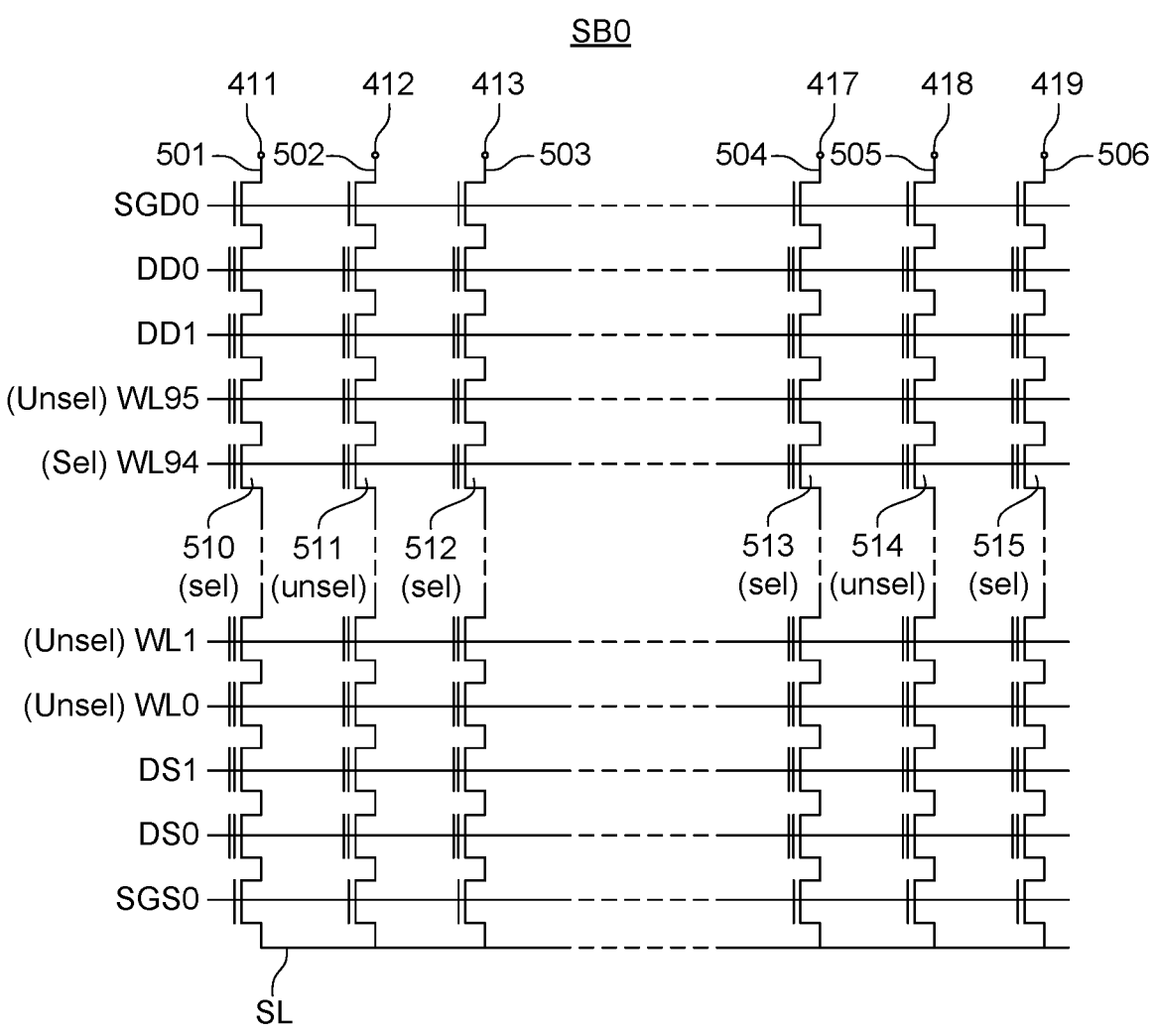
FIG. 4G is a schematic of horizontal sub-block HSB0.

FIG. 4G is a schematic of horizontal sub-block HSB0. Horizontal sub-blocks HSB1, HSB2 and HSB3 have similar structures. FIG. 4G shows physical wordlines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory archi-tecture, the memory type, and the memory operation, unse-lected memory cells may be actively or passively excluded from being subjected to the memory operation.

As an example of selected memory cells and unselected memory cells, during a programming process, the set of memory cells intended to take on a new electrical charac-teristic (or other characteristic) to reflect a changed pro-gramming state are referred to as the selected memory cells while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming opera-tion is to be performed and, for example purposes only, that wordline WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the program-ming operation is performed and the data pattern being programmed. For example, those memory cells that are to remain in the erased state S0 will be unselected memory cells, because their programming state will not change in order to store the desired data pattern, while those memory cells that are intended to take on a new electrical charac-teristic (or other characteristic) to reflect a changed pro-gramming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume for example purposes that memory cells 510, 512, 513 and 515 (which are connected to wordline WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figure 5:
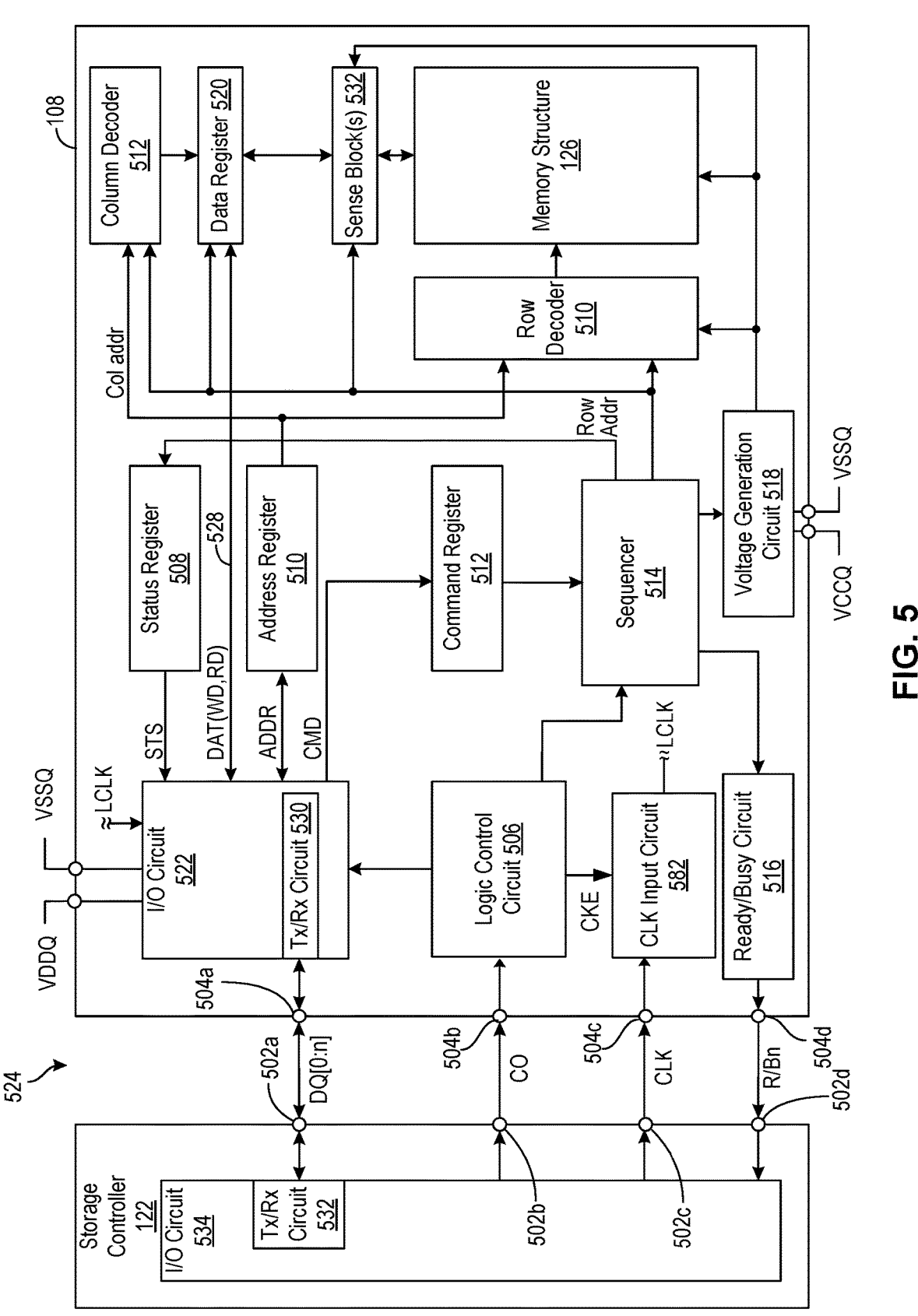
FIG. 5 is a block diagram of an example memory system that depicts more details of an example memory die, in connection with which embodiments of the disclosed technology can be implemented.

FIG. 5 is a block diagram of example memory system 500 that depicts more details of the example non-volatile memory system 100 and memory die 108. The memory die 108 may be connected to the storage controller 122 via the memory interface 524 and operates based on commands from the storage controller 122. For example, the memory die 108 transmits and receives, for example, one or more data signals (DQ signals) to and from the storage controller 122 via data bus 118 of the memory interface 524. The one or more DQ signals may be an n-bit wide signal, where each data signal is a 1-bit wide signal. For example, n may be 7, thus the DQ signal may be an 8-bit wide signal. The DQ signals may be encoded with input/output (I/O) data, for example, data in (DIN)/data out (DOUT) for data operations (e.g., read operations, write operations, etc.), address data (e.g., address codes) for address sequencing for the data operations, and/or command data (e.g., command codes) for command sequencing for the data operations.

Data sent over the DQ signals is latched with respect to a rising edge or a falling edge of a clock (CLK) signal. The CLK signal, in various examples, can include a pair of complementary CLK signals, such as a DQS (e.g., data strobe signal) and DQSB (e.g., inverse data strobe signal). The DQSB CLK signal is the logical inverse of the DQS CLK signal. The DQSB CLK signal is added for redundancy since rising and falling edges of one signal may be distorted during transmission. DQ data can be latched on either or both of the rising and falling edges of the CLK signal to achieve a double data rate.

The memory die 108 also receives control (CO) signals, such as, but not limited to, chip enable (CEn) signal, command latch enable (CLE) signal, address latch enable (ALE) signal, write enable (WEn) signal, and read enable (REn) signal from the storage controller 122 via bus lines DQ, CO, CLK, R/Bn of the memory interface 524. The memory die 108 also transmits control signals, for example but not limited to, a ready/busy signal (R/Bn) to the storage controller 102. In some embodiments, each of CO signals may be a one-bit wide signal. In other embodiments, the control signals CO signals may have other bit-widths as desired.

The storage controller 122 issues a command code to perform a read operation, a command code to perform a write operation, or the like to the memory die 108 in response to a command from a host device. The storage controller 122 manages the memory space of the memory die 108. As part of the read or write operation, the storage controller 122 issues various commands to perform for a respective operation and the memory die 108 and/or storage controller 122 transmit DIN/DOUT to complete the respective operation.

Storage controller 122 comprises I/O circuit 534 electrically connected to the I/O circuit 522 of the memory die 108 via a plurality of electrical contacts or terminals. The electrical contacts may comprise pads, pins, etc. for electrically connecting the memory die 108 to the storage controller 122 via a respective bus of the memory interface 524. For example, the storage controller 122 includes a plurality of contacts 502a-n electrically connected to a plurality of contacts 504a-n of the memory die 108. The I/O circuit 534 transmits the CO signals and CLK signal to the memory die 108 over the various buses of the memory interface 524 via respective pins and transmits DQ signals (e.g., DIN data signals) over the data bus DQ of the memory interface 524 via respective pins. The I/O circuit 522 can transmit the R/Bn signal to the storage controller 122 over the DQ bus and the DQ signals (e.g., DOUT data signals) over the DQ bus via respective pins.

As illustrated in FIG. 5, the memory die 108 includes I/O circuit 522, a logic control circuit 506, a status register 508, an address register 510, a command register 512, a sequencer 514, a ready/busy circuit 516, a voltage generation circuit 518, a data register 520, CLK input circuit 522, row decoder 510, a sense blocks 532, and column decoder 512. The various components 506-520 may be included as part of the die controller, for example, as part of the control circuit 506.

The I/O circuit 522 controls input and output of the DQ signals to and from the storage controller 122. For example, the I/O circuit 522 comprises a transmitter (Tx) and/or receiver (Rx) circuit 530 configured to exchange DQ signals with a transmitter (Tx) and/or receiver (Rx) circuit 530 on the I/O circuit 534 of storage controller 122. In the case of a write operation, Tx/Rx circuit 530 receives command codes and DIN from Tx/Rx circuit 532. Tx/Rx circuit 530 also DIN to data register 520, address codes to the address register 510, and command codes to the command register 512. DIN, command codes, and address codes are transmitted to the memory die 104a as DQ signals encoded with a bit pattern for the DIN, command, or address. The Tx/Rx circuit 530 also can transmits status information STS received from the status register 508, DOUT received from the data register 520 to be transmitted to the storage controller 122. STS and DOUT are transmitted as DQ signals encoded with a bit pattern for the STS or DOUT. The I/O circuit 522 and the data register 520 are connected via an internal data bus 528. For example, the internal data bus 528 includes a plurality internal I/O data lines (e.g., 100 to 107 corresponding to 8-bit DQ signals such as DQ[0:7]). The number of internal I/O data lines is not limited to eight, but may be set to 16, 32, or any number of data lines.

The logic control circuit 506 receives, for example, the CO signals from the storage controller 122 via CO bus. Then, logic control circuit 506 controls the I/O circuit 522 and the sequencer 514 in accordance with a received signal. The status register 508 temporarily stores status information STS, for example, in a write operation, a read operation, and an erasing operation for data and notifies the storage controller 122 whether the operation normally ends.

The address register 510 temporarily stores the address code received from the storage controller 122 via the I/O circuit 522. For example, the I/O circuit 522 may detect DQ signals and sample the DQ signals according to the CLK signal to obtain a bit pattern encoded thereon. The I/O circuit 522 may then decode the bit pattern to obtain the data, which in this example may be an address code. The address code is then temporarily stored in the address register 510. Then, the address register 510 transmits a row address (row addr) to the row decoder 510 and transmits a column address (col addr) to the column decoder 512.

The command register 512 temporarily stores the command code received from the storage controller 122 via the I/O circuit 522 and transmits the command code to the sequencer 514. For example, the I/O circuit 522 may detect DQ signals and sample the DQ signals according to the CLK signal to obtain a bit pattern encoded thereon. The I/O circuit 522 may then decode the bit pattern to obtain the data, which in this example may be a command code. The command code is then temporarily stored in the command register 512.

The sequencer 514 controls operation of the memory die 108. For example, the sequencer 514 controls the status register 508, the ready/busy circuit 516, the voltage generation circuit 518, the row decoder 510, the sense blocks 532, the data register 520, the column decoder 512, and the like according to a command code stored in the command register 512 to execute the write operation, the read operation, and the erasing operation according to the code.

The ready/busy circuit 516 transmits the R/Bn signal to the storage controller 102 according to an operation state of the sequencer 514. For example, the R/Bn signal is transmitted to the storage controller 122 via the control bus 526 of the memory interface 524.

The voltage generation circuit 518 receives a high supply voltage VDDQ and low supply voltage VSSQ (which may be ground or zero in some embodiments) and generates voltages necessary for a desired operation (e.g., a write operation, a read operation, or an erasing operation) according to control of the sequencer 514. For example, voltage generation circuit 518 may generate a reference voltage Vref for distinguishing between logic states of a read or write operation. The voltage generation circuit 518 supplies the generated voltage, for example, to the memory structure 506, the row decoder 510, and the sense blocks 532. The row decoder 510 and the sense blocks 532 apply a voltage supplied from the voltage generation circuit 518 to memory cells in the memory structure 506.

The data register 520 includes a plurality of latch circuits. The latch circuits store the write data (WD) and the read data (RD). For example, in a write operation, the data register 520 temporarily stores the write data received from the I/O circuit 522 and transmits the write data to the sense blocks 232. For example, in a read operation, the data register 520 temporarily stores the read data received from the sense blocks 232 and transmits the read data to the I/O circuit 222.

The clock input circuit 582 receives the clock signal CLK via pin 504c. The CLK signal may be two complementary clock signals (e.g., DQS and DQSB). The clock input circuit 582 receive a clock enable signal CKE from the logic control circuit 506 and provides a phase controlled internal clock signal LCLK. The phase controlled internal clock signal LCLK is supplied to the I/O circuit 222 and is used as a timing signal for sampling DIN/DOUT on the data bus as well as performing other functions of the memory die 104a.

The I/O circuit 522 is supplied with high supply voltage VDDQ and low supply voltage VSSQ via respective pins. The supply voltages VDDQ and VSSQ may be used for the I/O circuit 522 so that power supply noise generated by the I/O circuit 522 does not propagate to the other circuit blocks of device memory die 108.

Figure 6B:
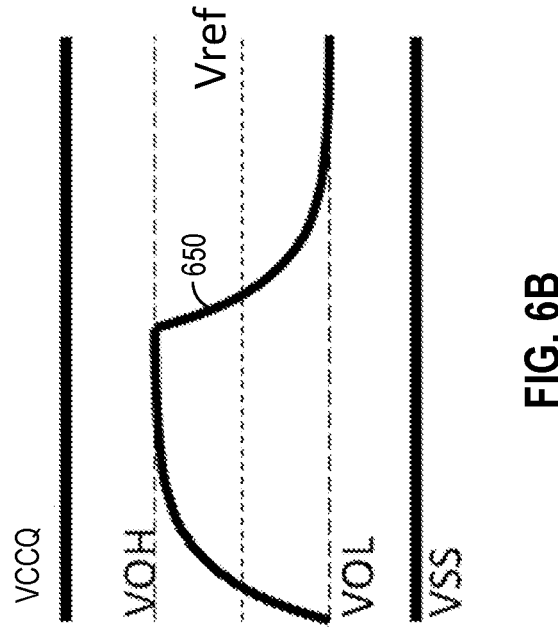
FIG. 6B is an example input signal waveform generated by the CTT logic circuit, according to one embodiment.
Figure 6A:
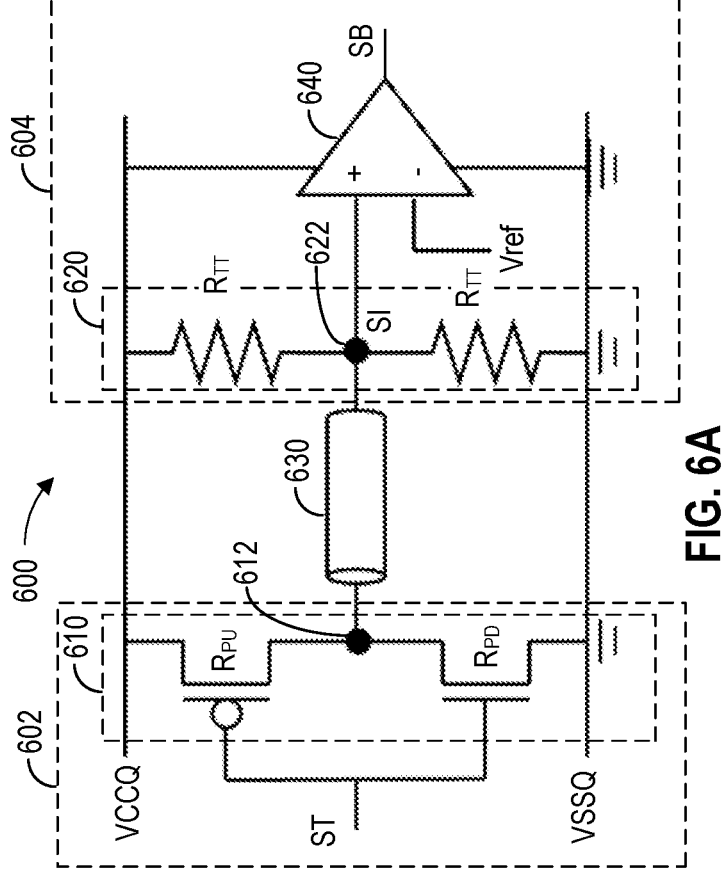
FIG. 6A is an example circuit implementation of center-tapped termination (CTT) logic, according to one embodiment.

FIG. 6A is an example illustration of a center tapped termination (CTT) logic circuit. FIG. 6B is an example I/O signal waveform 650 transmitted from the transmitting device to the a receiving device via the CTT logic circuit.

Referring to FIG. 6A, the circuit 600 comprises a transmission driver 610 on a transmitting device 602 connected to a termination circuit 620 on a receiving device 604. The transmission driver 610 in the transmitting device 602 drives an I/O pad 612 based on a transmission signal (ST) from an internal signal of the transmitter device 602. The I/O pad 612 of the transmission driver 610 is connected to I/O pad 622 of receiving device 604 through a bus line 630. A termination circuit 620 of the CTT logic is connected to the I/O pad 622 of the receiving device 604 for impedance matching so to reduce signal reflection. An input receiver (IREC) 640 (also referred to as a reception buffer) is provided in the receiving device 604 configured to compare the input signal SI received through the I/O pad 622 with a reference voltage Vref to provide a buffer signal BF to an internal circuit of the receiving device 604.

In an example implementation, the transmitting device 602 may be the storage controller 102 with I/O circuit 234 comprising transmission driver 610 as an example Tx/Rx circuit 532 and the receiving device 604 may be the memory die 104a with I/O circuit 222 comprising termination circuit 620 and input receiver 640 as an example Tx/Rx circuit 530, for example, in a case of a write operation in which storage controller 102 is transmitting DIN data to memory die 104a. Further, bus line 630, I/O pad 612, and I/O pad 622 may be implemented as a data bus line of data bus 228, one of contacts 502a, and one of contacts 504a. That is, in a case of an 8-bit wide data bus 228, there may be eight contacts 502a and eight contacts 504a. Each respective contact 502a is connected to a respective contact 504a via a data bus line of data bus 228. FIG. 6A depicts one such configuration, where bus line 630 is an example of a single line of the data bus 228, and I/O pads 612 and 622 are single electrical contact or pads.

In another example, the transmitting device 602 may be the memory die 104a with I/O circuit 222 comprising transmission driver 610 as an example Tx/Rx circuit 530 and the receiving device 604 may be the storage controller 102 with I/O circuit 234 comprising transmission driver 620 and input receiver 640 as an example Tx/Rx circuit 532, in a case of a read operation in which memory die 104a is transmitting DOUT data to storage controller 102. In this scenario, bus line 630, I/O pad 612, and I/O pad 622 may be implemented as a data bus line of data bus 228, one of contacts 504a, and one of contacts 502a.

The transmission driver 610 may include a pull-up driver $R_{PU}$ connected between a first power supply voltage VCCQ and the I/O pad 612 and a pull-down driver $R_{PD}$ connected between the I/O pad 612 and a second power supply voltage VSSQ lower than the first power supply voltage VCCQ. The pull-up driver $R_{PU}$ may include a p-channel metal oxide semiconductor (PMOS) transistor that is switched in response to the transmission signal ST. The pull-down driver $R_{pd}$ may include a n-channel metal oxide semiconductor (NMOS) transistor that is switched in response to the transmission signal ST. Each of pull-up driver $R_{PU}$ and pull-up driver $R_{PU}$ may have a resistance $R_{on}$ between the VCCQ and VSSQ, respectively, and the I/O pad 612 when each of the pull-up driver $R_{PU}$ and pull-up driver $R_{PU}$ is turned on based on the transmission signal ST.

The termination circuit 620 may include a first sub termination circuit connected between the first power supply voltage VCCQ and the I/O pad 622 and a second sub termination circuit connected between the I/O pad 622 and the second power supply voltage VSSQ. The first sub termination circuit may include a first termination resistor $R_{TT}$ and the second sub termination circuit may include a second termination resistor $R_{TT}$.

In case of the termination circuit 620, a high voltage level VOH and a low voltage level VOL of the input signal SI may be represented as waveform 650 shown in FIG. 6B. The second power supply voltage VSSQ may be assumed to be a ground voltage (e.g., VSSQ=0) and the voltage drop along the transmission line 630 may be neglected. Thus, reference voltage Vref for the CTT scheme may be calculated as follows:

$$VOH = VDDQ\frac{R_{ON} + R_{TT}}{2R_{ON} + R_{TT}} \qquad \text{Eq. 1}$$

$$VOL = VDDQ\frac{R_{ON}}{2R_{ON} + R_{TT}} \qquad \text{Eq. 2}$$

$$VREF = \frac{VOH + VOL}{2} = \frac{VDDQ}{2} \qquad \text{Eq. 3}$$

Thus, Vref is a fixed value at half of VCCQ, because the high voltage level VOH is fixed based on VCCQ applied to the first sub termination circuit.

The receiving device can distinguish between a logic high level and a logic low level of an encoding in the transmission signal ST by leveraging the comparison of the input signal SI with the reference voltage Vref at IREC 640. For example, as shown in FIG. 6B, a logic low level may be detected when the voltage level of the input signal SI is below the reference voltage Vref (e.g., at low voltage level VOL), while a logic high level may be detected when the voltage level on the input signal SI is above the reference voltage Vref (e.g., at high voltage level VOH). Due to the high voltage level VOH being fixed and the reference voltage Vref being fixed at half VCCQ, as described above, the receiving device 604 can distinguish between the logic high level and logic low level to accurately detect data on the bus line 630.

Figure 7B:
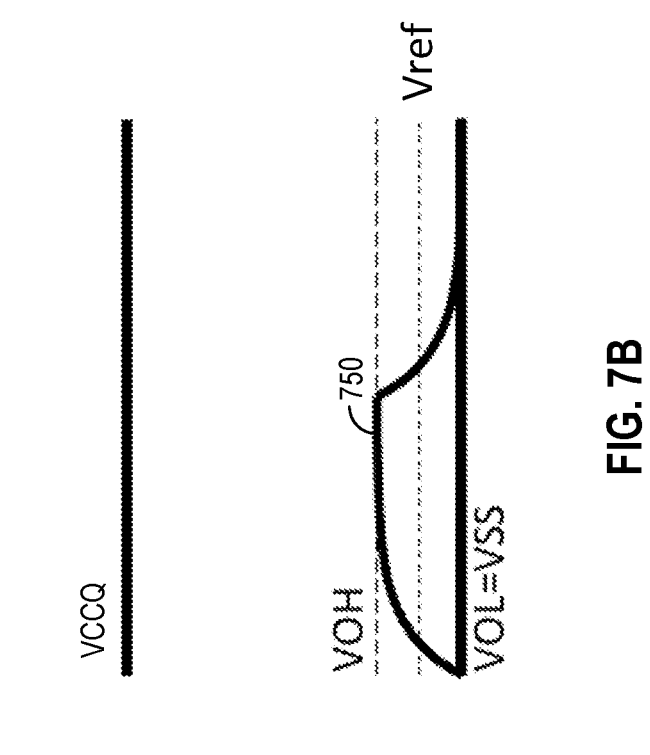
FIG. 7B is an example input signal waveform generated by the LVST logic circuit, according to one embodiment.
Figure 7A:
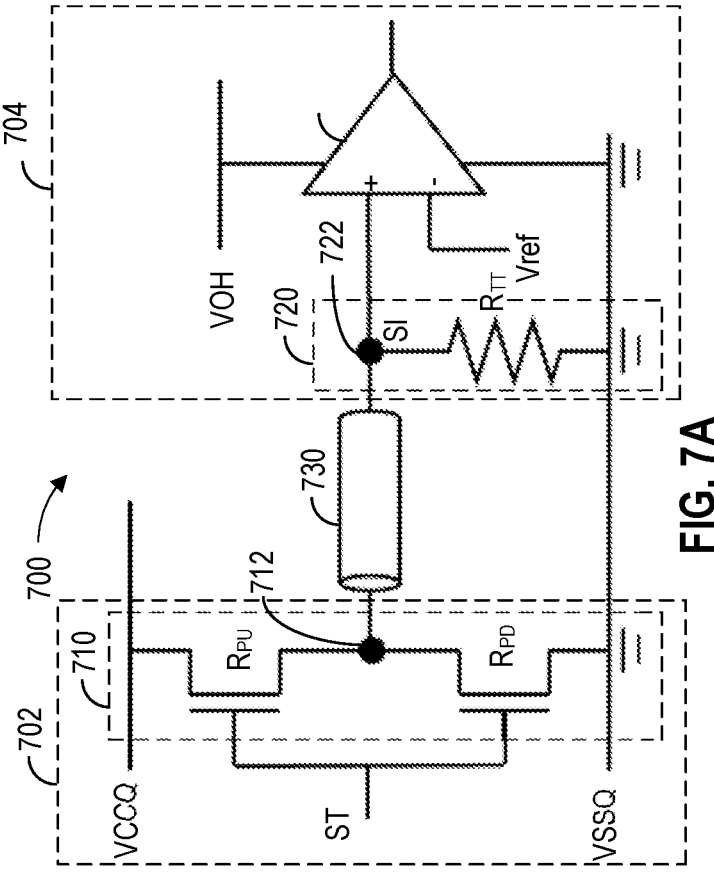
FIG. 7A is an example circuit implementation of a low-voltage swing termination (LVST) logic.

FIG. 7A is an example circuit implementation 700 of a low-voltage swing termination (LVST) logic. FIG. 7B is an example input signal waveform 750 received by a receiving device in the LVST logic. Low-voltage swing termination may also be referred to as low-tapped termination (LTT).

The circuit 700 comprises a transmission driver 710 on a transmitting device 702 connected to a termination circuit 720 on a receiving device 704. The transmission driver 710 in the transmitting device 704 drives an I/O pad 712 based on a transmission signal ST from an internal signal of the transmitter device 702. The I/O pad 712 of the transmission driver 710 is connected to I/O pad 722 of receiving device 704 through a bus line 730. A termination circuit 720 is connected to the I/O pad 722 of the receiving device 704 for impedance matching so to reduce signal reflection. A IREC 740 (also referred to as reception buffer 740) is provided in the receiving device 704 configured to compare the input signal SI received through the I/O pad 722 with a reference voltage Vref to provide a buffer signal BF to an internal circuit of the receiving device 704.

In an example implementation, the transmitting device 702 may be the storage controller 102 with I/O circuit 234 comprising transmission driver 710 as an example Tx/Rx circuit 532 and the receiving device 702 may be the memory die 104a with I/O circuit 222 comprising termination circuit 720 and input receiver 740 as an example Tx/Rx circuit 530, for example, in a case of a write operation in which storage controller 102 is transmitting DIN data to memory die 104a. Further, bus line 730, I/O pad 712, and I/O pad 722 may be implemented as a data bus line of data bus 228, one of contacts 502a, and one of contacts 504a.

In another example, the transmitting device 702 may be the memory die 104a with I/O circuit 222 comprising transmission driver 710 as an example Tx/Rx circuit 530 and the receiving device 704 may be the storage controller 102 with I/O circuit 234 comprising termination circuit 720 and input receiver 740 as an example Tx/Rx circuit 532, in a case of a read operation in which memory die 104a is transmitting DOUT data to storage controller 102. In this scenario, bus line 730, I/O pad 712, and I/O pad 722 may be implemented as a data bus line of data bus 228, one of contacts 504a, and one of contacts 502a.

The transmission driver 710 may include a pull-up driver $R_{PU}$ connected between a first power supply voltage VCCQ and the I/O pad 712 and a pull-down driver $R_{PD}$ connected between the I/O pad 712 and a second power supply voltage VSSQ lower than the first power supply voltage VCCQ. The pull-up driver $R_{PU}$ may include a NMOS transistor that is switched in response to the transmission signal ST. The pull-down driver $R_{PD}$ may include a NMOS transistor that is switched in response to the transmission signal ST. Each of pull-up driver $R_{PU}$ and pull-up driver $R_{PU}$ may have a resistance $R_{on}$ between the VCCQ and VSSQ, respectively, and the I/O pad 712 when each of the pull-up driver $R_{PU}$ and pull-up driver $R_{PU}$ is turned on based on the transmission signal ST. The termination circuit 720 may include a termination resistor $R_{TT}$ connected between the I/O pad 722 and the low power supply voltage VSSQ.

In case of the termination circuit 720, the high voltage level VOH and the low voltage level VOL of the input signal SI may be represented as waveform 750 shown in FIG. 7B. The low power supply voltage VSSQ may be assumed to be a ground voltage (e.g., VSSQ=0) and the voltage drop along the transmission line 730 may be neglected. Thus, the low voltage level VOL is equal to VSSQ and because the high voltage level VOH is not fixed, the reference voltage Vref is unknown. However, the LVST logic provides for low power consumption in the termination circuit 720 since the high voltage level VOH is not fixed to the high voltage level VCCQ. Thus, lower voltage levels may be utilized as the high voltage level (e.g., lower than VDDQ), which results in lower voltage swings and reduced power consumption along the bus line 730 and receiving device 704. For example, the power consumption on bus line 730 can be reduced up to approximately 50% as compared to power consumption on bus line bus line 630 of the CTT logic. Yet to implement the circuit implementation 700, the IREC 740 needs to be fed a reference voltage Vref that can be used to distinguish between different logic levels in the voltage swings. Accordingly, training receiving device 704 is needed to so that receiving device 704 can locate a reference voltage Vref that can be used by the IREC 740 in distinguishing between different logic levels on the input signal SI to decode a data pattern and latch incoming data correctly.

Figure 8:
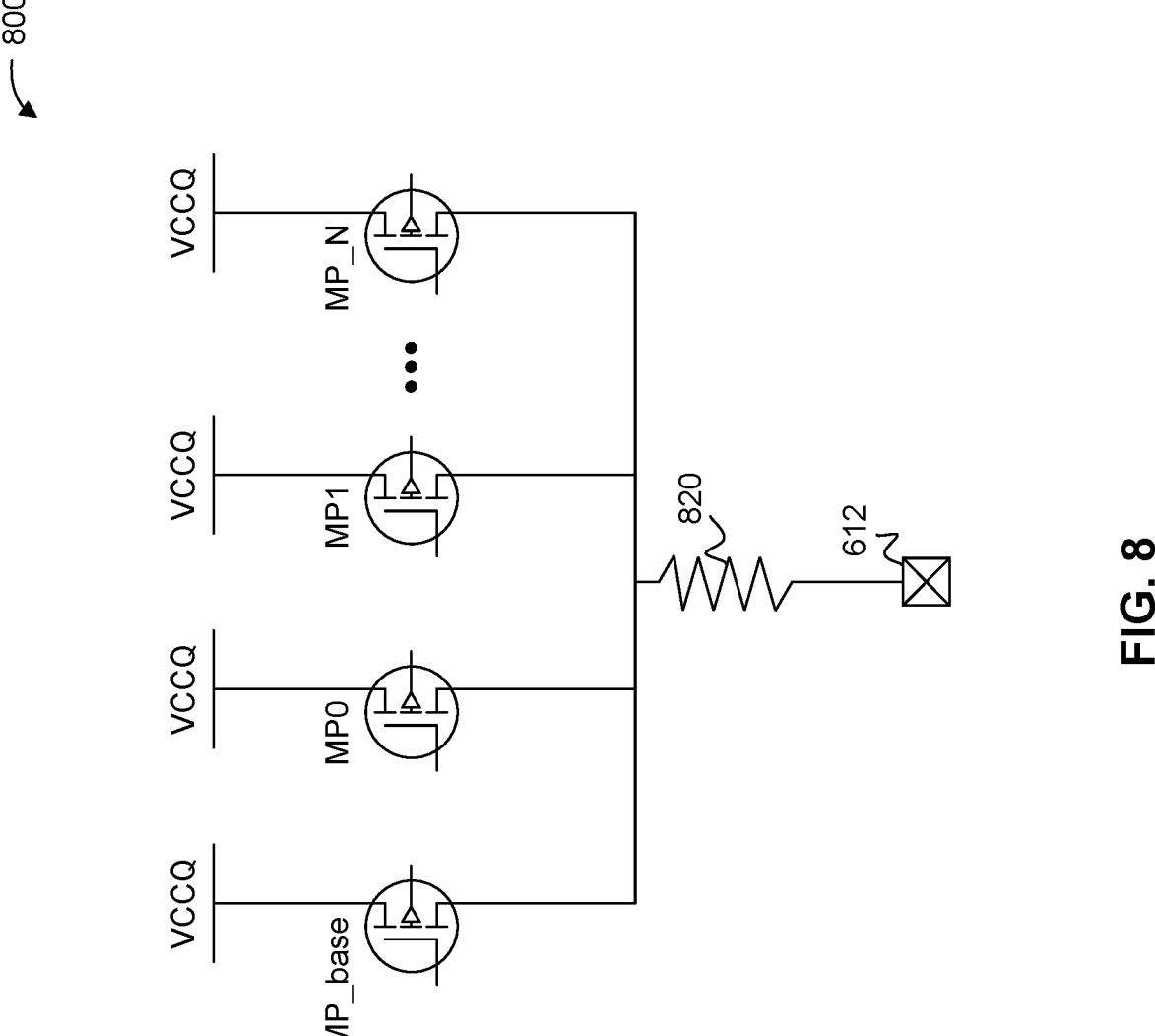
FIG. 8 is a schematic illustration of a PMOS based pull-up driver, according to one embodiment.
Figure 9:
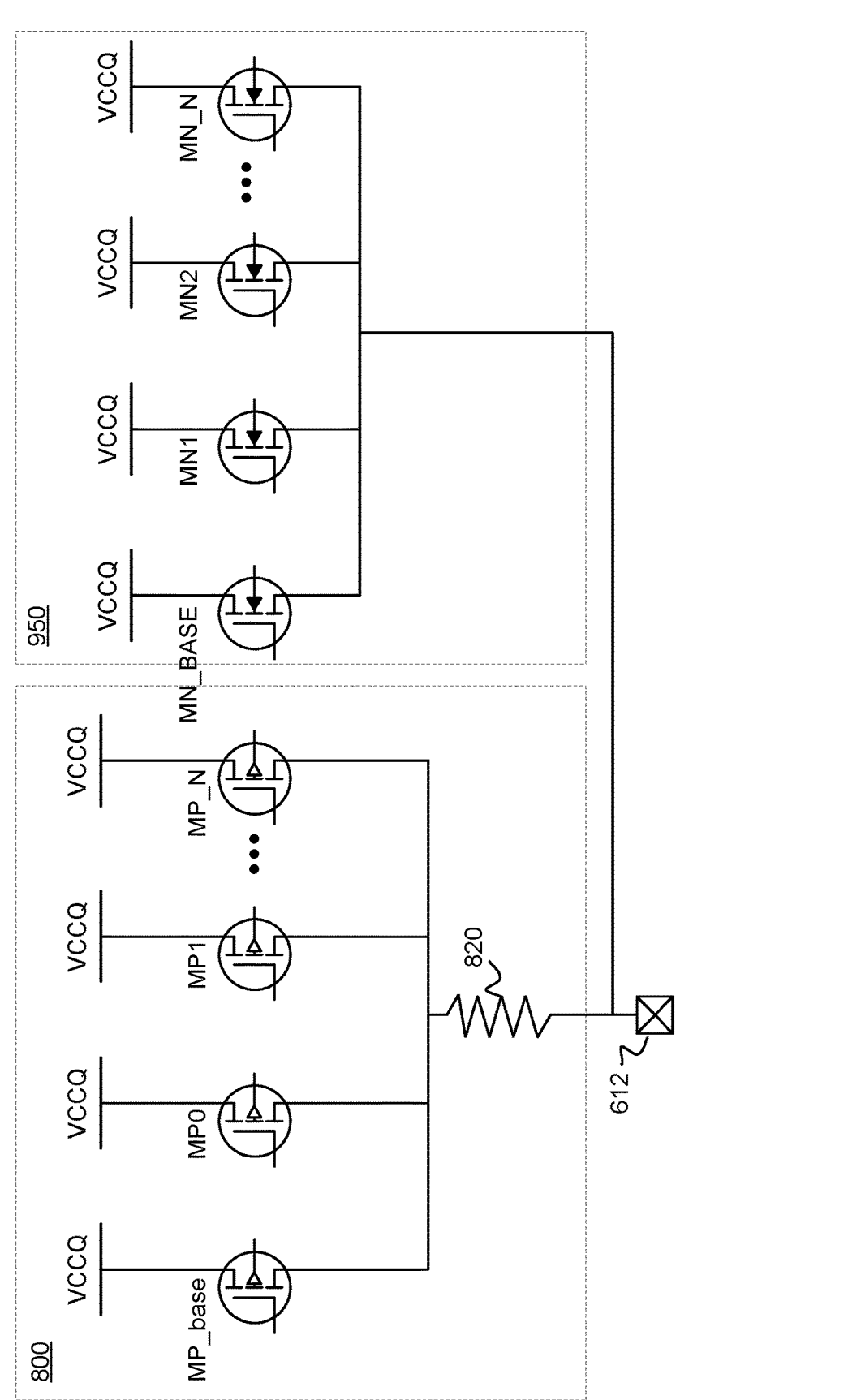
FIG. 9 is a schematic illustration of a combination PMOS and NMOS pull-driver, according to one embodiment.

FIGS. 8 and 9 are schematic illustrations of conventional designs for PMOS and a combination PMOS and NMOS pull-up drivers. The conventional PMOS based pull-up driver is typically used for NV-DDR3 operation. The conventional PMOS based pull-up driver can also be used in NV-LPDDR4 operation. However, the conventional PMOS based pull-up driver suffers from a variety of fatal flaws when used in NV-LPDDR4 operation. For example, during operation in NV-LPDDR4, the PMOS based pull-up driver performance degrades due to an imbalance in output rise and fall in slew-rates as pull-up impedance is doubled compared to ODT impedance. This failure is amplified, and thus especially significant, when a higher load is applied. The conventional design of a combination PMOS and NMOS pull-up driver addresses the deficiencies of the PMOS based pull-up driver during NV-LPDDR4. However, the combination PMOS and NMOS pull-up driver results in an increase in area (e.g., footprint of the circuit), an increase in capacitance at the I/O pad 612 and an increase in power (both static power and dynamic power). The proposed driver allows the PMOS based-pull up driver to be used in NV-LPDDR4 without the need for the plurality of NMOS pull-up drivers. Thus, the proposed driver results in area savings and power savings while meeting the performance and output requirements of the ONFI specification.

Referring now to FIG. 8, the PMOS based pull-up driver includes a plurality of PMOS transistors. The plurality of PMOS transistors includes a "N+2" number of PMOS transistors. For example, MPbase PMOS transistor, an MP0 PMOS transistor, an MP1 PMOS transistor and so on up to MP_N PMOS transistor. Each PMOS transistor includes a gate, source and drain. The source of each PMOS transistor is communicatively coupled the VCCQ. For example, the source of the MPbase PMOS transistor is communicatively coupled to the VCCQ bus. For example, the source of the MP0 PMOS transistor is communicatively coupled to the VCCQ bus. For example, the source of the MP1 PMOS transistor is communicatively coupled to the VCCQ bus. For example, the source of the MP_N PMOS transistor is communicatively coupled to the VCCQ bus. In one embodiment, the drain of each PMOS transistor is communicatively coupled to resistor 820. The resistor 820 is communicatively coupled to the I/O pad 612. For example, the drain of MPbase PMOS transistor is communicatively coupled to resistor 820. The drain of MP0 PMOS transistor is communicatively coupled to resistor 820. The drain of MP1 PMOS transistor is communicatively coupled to resistor 820. The drain of MP_N PMOS transistor is communicatively coupled to resistor 820.

When the conventional PMOS based pull-up driver of NV-DDR3 is used in NV-LPDDR4 mode, the performance degrades due to an imbalance in output rise and fall slew-rates as pull-up impedance is double compared to on-die termination (ODT) and pull-down impedance. Due to the imbalance in output rise and fall in slew-rates the output common mode falls significantly violating ONFI NAND requirements. For example, when the conventional PMOS based pull-up driver is used in NV-LPDDR4, the PMOS based pull-up driver will be having low current driving capability. For NV-LPDDR4 protocol, ZQ calibration is done at VOH level (e.g. VCCQ/3, VCCQ/2.5) and signal would transition from VOL (=0) to VOH for low to high transition and VOH to VOL(=0) for high to low transition. Pull-up would be used for low to high transition. For PMOS based Pull-up driver, due to nonlinearity, pull-impedance would be higher when it starts charging output from 0(VOL) and it gradually decreases to calibrated value when output signal reaches to VOH. Due to this and as pull-up impedance is double than ODT and pull-down impedance at VOH (calibration voltage) level, signal rising slew-rate is much lesser compared to signal fall slew-rate and imbalance in output rise and fall slew-rate increases as output load increases. Here, the I/O pad 612 may not reach the required VOH voltage levels at high speed. To boost slew rate if the pre-driver is strengthened and power is increased, even then if it reaches the required VOH voltage level, because of the imbalance in slew-rates output common mode falls and VREFQ will not be within specification.

FIG. 9 is a schematic illustration of a conventional combination PMOS/NMOS pull-up driver, according to one embodiment. The combination PMOS/NMOS pull-up driver (hereafter referred to as a combination pull-up driver) includes a plurality of PMOS transistors and NMOS transistors communicatively coupled to the I/O pad 612. The plurality of PMOS transistors includes a (N+2) number of PMOS transistors. For example, MPbase PMOS transistor, MP0 PMOS transistor, MP1 PMOS transistor, and MP_N PMOS transistor, etc. The plurality of NMOS transistors include a (N+2) number of NMOS transistors. For example, MPbase PMOS transistor, MN1 PMOS transistor, MN2 PMOS transistor and MP_N transistor, etc.

Each PMOS and NMOS transistor includes a gate, source and drain. The source of each PMOS transistor is communicatively coupled to the VCCQ. For example, the source of the MPbase PMOS transistor is communicatively coupled to the VCCQ bus. For example, the source of the MP0 PMOS transistor is communicatively coupled to the VCCQ bus. For example, the source of the MP1 PMOS transistor is communicatively coupled to the VCCQ bus. For example, the source of the MP_N PMOS transistor is communicatively coupled to the VCCQ bus. In one embodiment, the drain of each PMOS transistor is communicatively coupled to resistor 820. The resistor 820 is communicatively coupled to the I/O pad 612. For example, the drain of MPbase PMOS transistor is communicatively coupled to resistor 820. The drain of MP0 PMOS transistor is communicatively coupled to resistor 820. The drain of MP1 PMOS transistor is communicatively coupled to resistor 820. The drain of MP_N PMOS transistor is communicatively coupled to resistor 820.

The drain of each NMOS transistor is communicatively coupled to the VCCQ. For example, the drain of MNbase NMOS transistor is communicatively coupled to the VCCQ bus. For example, the drain of the MN1 NMOS transistor is communicatively coupled to the VCCQ bus. For example, the drain of the MN2 NMOS transistor is communicatively coupled to the VCCQ bus. For example, the drain of the MN_N NMOS transistor is communicatively coupled to the VCCQ bus. The source of each NMOS transistor is communicatively coupled to the I/O pad 612. For example, the source of the MNbase NMOS transistor is communicatively coupled to the I/O pad 612. The source of the MN1 NMOS transistor is communicatively coupled to the I/O pad 612. The source of the MN2 NMOS transistor is communicatively coupled to the I/O pad 612. The source of the MN_N NMOS transistor is communicatively coupled to the I/O pad 612.

To get back performance, the NMOS based pull-up driver is used in NV-LPDDR4 mode. Contrary to PMOS based pull-up, pull-up impedance would be much lower at VOL (=0) compared to calibrated pull-up impedance for NMOS based pull-up as VGS of NMOS is much higher when signal is low compared to VGS at calibration voltage (e.g. VCCQ/3, VCCQ/2.5). e.g., for VOH=VCCQ/3, NMOS based pull-up would be calibrated at VCCQ/3 and at that voltage, VGS of NMOS would be "VCCQ*2/3" but when signal is low, VGS of NMOS would be "VCCQ" which is ~33% higher compared to calibrated impedance which results in much lower pull-up impedance when output signal start rising thus output signal rise slew-rate increases significantly. Accordingly, I/O pad 612 will reach the required VOH level without violating the VREFQ specification requirements. However, the VGS of the NMOS at the calibration point will be ⅔ of the VCCQ, thus requiring a greater number of NMOS transistors and subsequent data-path. The additional NMOS transistors significantly increase area and power.

Figure 10A:
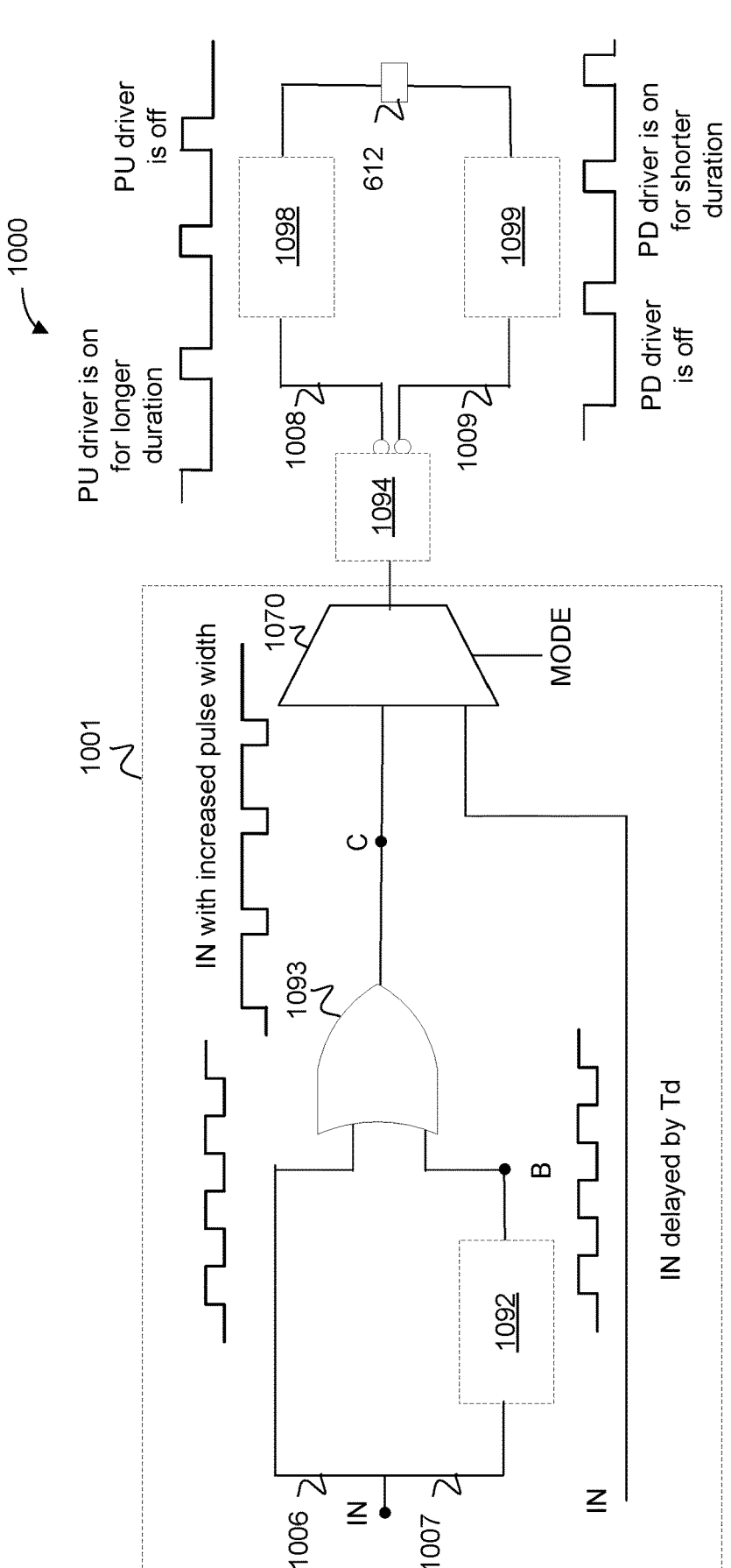
FIG. 10A illustrates a signal path to the PAD, according to one embodiment.

FIG. 10A illustrates a signal path to the PAD, according to one embodiment. At node B, the input signal is delayed by a second amount Td. The delay Td alters the pulse width of the input voltage signal to have an increased pulse width. The increased pulse width of the voltage signal can be observed at node C. For example, delay block 1092 applies to a delay Td to the input signal.

In TM5 mode, the skew gen block increases the pulse width of the input voltage signal and transmits voltage signal with increased pulse width to the pull-up driver 1098 and pull-down driver 1099 via connections 1008 and 1009. This increased pulse width at the driver allows the pull-up driver to be on for higher duration, thus allowing the PAD 612 to reach the required VOH level.

The signal path includes an OR logic gate 1093, a delay block 1092, a MUX 1070, a pull-up predriver 1098 and a pull-down predriver 1099. The amount of delay created by the delay block 1092 affects the width of the pulse (e.g., the duration of the pulse).

In a configuration, the pulse width can be determined/altered using the following equations:

$$TPH_{skew} = TPH + (td) \qquad \text{Equation 1}$$

$$TPL_{skew} = TPL - (td) \qquad \text{Equation 2}$$

Td represents the amount of delay of the delay block 1092. TPH refers to the pulse high pulse width of the input data signal, and TPL refers to the pulse low pulse width of the input data signal. TPHskew refers to the increased pulse width of the pulse high input data signal. TPLskew refers to the decreased pulse width of the pulse low input data signal. Equation 1 can be used to determine the pulse width. Using this equation, the pulse duration (e.g., the width of the pulse) can be determined based on the delay of the delay block 1092. In addition, in POD signaling, TPHskew refers to the decreased pulse width of the pulse high input data signal and TPLskew refers to the increased pulse width of the pulse low input data signal.

Figure 10B:
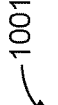
FIG. 10B is a schematic illustration of a skew-gen circuit, according to one embodiment.
Figure 10B:
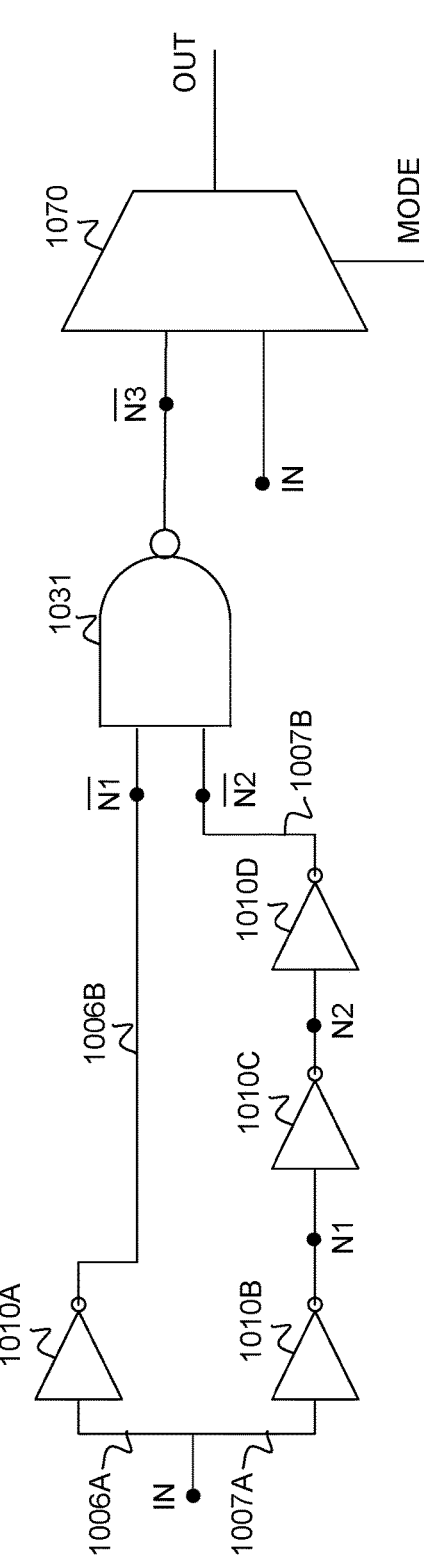

FIG. 10B is an example illustration of a skew gen circuit 1001, according to one embodiment. The skew gen circuit 1001 alters the pulse width of the data high signal. In one embodiment, a first data high signal having a first pulse duration is applied as an input to the skew gen circuit 1001. The skew gen circuit 1001 outputs the first data high signal as a "skewed" out data high signal having an increased pulse duration. The increased pulse duration can be observed as an increased pulse width. For purposes of the disclosure herein "skewed" refers to an altered pulse width of a data high signal. The altered data high signal is any input signal that undergoes an observable change to its waveform to generate an output waveform that includes different waveform features than the input signal. In one embodiment, the different waveform features include amplitude, duration (e.g., width) and phase of the waveform. For example, the pulse width of the input data high signal is less than the pulse width of the output data high signal coming from the skew-gen circuit 1001. Altering the voltage waveform generates additional time for the driver output signals to reach rail to rail.

The plurality of skew-gen circuit components are configured to increase the pulse width of the I/O data high signal. Each individual component of the plurality of skew-gen circuit components is configured to alter the data high signal. For example, the plurality of inverters comprising three inverters coupled in series and the inverter coupled to the second input of the AND gate are configured to skew the data high signal by increasing the pulse width. The skewed data high signal is transmitted to the pull up predriver and the pull down predriver to perform I/O functions.

The skew gen circuit 1001, in one implementation, may include a plurality of inverters 1010A-D, 1050, an AND gate and a MUX 1070. The plurality of inverters 1010A-D are coupled to a two input AND gate 1030. In one implementation, the plurality of inverters 1010 include a first inverter 1010A, a second inverter 1010B, third inverter 1010C and a fourth inverter 1010D. In one implementation, the first inverter 1010A is coupled to a first input of the AND gate 1030 and the second inverter 1010B, third inverter 1010C and fourth inverter 1010D are coupled to the second input of the AND gate 1030. In one embodiment, the second inverter 1010B, third inverter 1010C and fourth inverter 1010D are coupled in series. For example, as seen in FIG. 10, the output of the second inverter 1010B is coupled to the input of the third inverter 1010C. The output of the third inverter 1010C is coupled to the input of the fourth inverter 1010D. The output of the fourth inverter 1010D is coupled to the second input of the AND gate 1030.

Inverter 1050 is communicatively coupled to both the AND gate 1030 and the MUX 1070. The output of the AND gate 1030 is communicatively coupled to an input of inverter 1050. The output the inverter 1050 is communicatively coupled to the first input of the MUX 1070. The MUX 1070 includes the first input, a second input, a mode input, and an output. In one configuration, the two-input AND logic gate 1030 and inverter 1050 are replaced with a two-input NAND logic gate 1031. The output of the two-input NAND logic gate 1031 is coupled to the input of MUX 1070.

During NV-DDR3 operation, the skew gen block will not disturb the voltage wave except imparting a slight delay to the data high signal transmitted to the I/O PAD 612. NV-DDR3 operation does not require the skew gen circuit 1000, thus using the mode input, the skew gen circuit 1000 can be selectively used depending on whether the I/O is in NV-DDR3 operation or NV-LPDDR4 operation. For example, during NV-DDR3 operation (e.g., "TM4 mode"), the skew gen circuit 1000 is inoperable. During NV-LPDDR4 (e.g., "TM5 mode"), the skew gen circuit 1000 is used to skew the pulse width of the data high signal.

Inverter 1010A and inverter 1010B both have the same input. The plurality of inverters 1010B, 1010C and 1010D each alter the data high signal to increase the pulse width. As the data high signal is passed through each inverter of the plurality of inverters, the pulse width of the data high signal is increased. Thus, the amount of inverters can be increased or decreased to adjust the delay.

The input data signal is transmitted along path 1006A to inverter 1010A and along path 1007A to inverter 1010B. The input data signal is inverted at inverter 1010A and inverter 1010B. The inverted data signal generated by inverter 1010B is further passed through inverters 1010C and 1010D where it is inverted two more times. Although three inverters 1010B, 1010C and 1010D are shown, any number of inverters can be used. The amount of inverters coupled in series increases the pulse width of the data high signal. Each data signal generated by paths 1006 and 1007 is applied as a respective input to the two input AND gate 1030. For example, the data signal generated by path 1006 is applied as a first input to the AND gate 1030 and the data signal generated by path 1007 is applied as a second input to the AND gate 1030. The data signal is delayed by path 1006 and by path 1007. The data signal is transmitted to the NAND logic gate 1031 so that the data signal is skewed so that the data high signal pulse width is increased and data low signal pulse width is reduced. The skewed data signal is applied as an input to MUX 1070.

Figure 10C:
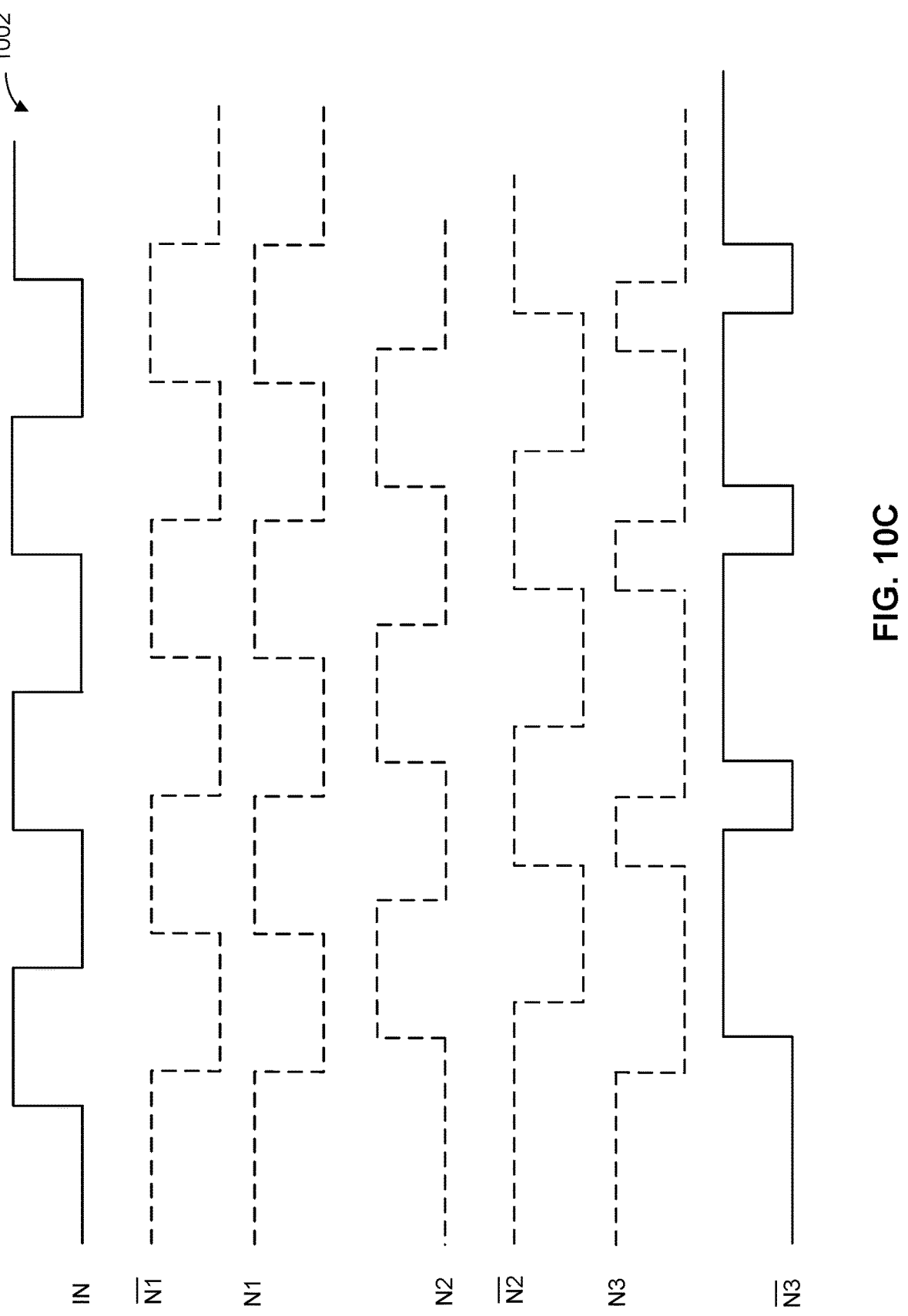
FIG. 10C is a timing diagram of an input pulsed waveform applied to the skew-gen circuit, according to one embodiment.

FIG. 10C is a timing diagram of an input data signal applied to the skew-gen circuit, according to one embodiment. The timing diagram includes a plurality of example data high signals. Each data high signal corresponds to a data high signal observed at a node of the plurality of nodes of the skew-gen circuit 1000. At node IN, an input data high signal is applied to the skew-gen circuit 1000. The input data high signal includes a duty cycle having a first pulse width. For example, the data high signal includes a pulse duration of about 50% of the duty cycle (e.g., the data high signal includes a pulse width of about 50% of the duty cycle).

The data signal observed at nodes $\overline{N2}$ and $\overline{N1}$, includes an altered pulse width compared to the input data high pulse width IN. As seen by the data signals observed at nodes N1, N2 and $\overline{N2}$, each inversion of the voltage waveform slightly alters the data high pulse. For example, the data signal observed at node $\overline{N1}$ includes a first altered data signal, and the data signal observed at node $\overline{N2}$ includes a second altered data signal. The data signals observed at nodes $\overline{N1}$ and $\overline{N2}$ are applied to the NAND gate 1031 as inputs. The NAND gate 1031 returns the data\signal observed at node $\overline{N3}$. The data signal observed at node $\overline{N3}$ includes a data high pulse width that is greater than the data high pulse width of the input data signal. The altered pulse duration of the data signal in FIG. 10B is not limited to a drastic change in pulse duration (e.g., an input data signal having a pulse duration of 50% percent and an altered data signal having a pulse duration of 80%), and can be an altered pulse duration of more or less than a percent. For example, the input data high signal IN includes a pulse duration that is 48% of the duty cycle, and the data high signal observed at $\overline{N3}$ includes a pulse duration that is 49% percent of the duty cycle.

Figure 10D:
FIG. 10D is an example of an alternative skew-gen circuit configuration, according to one embodiment.
Figure 10D:
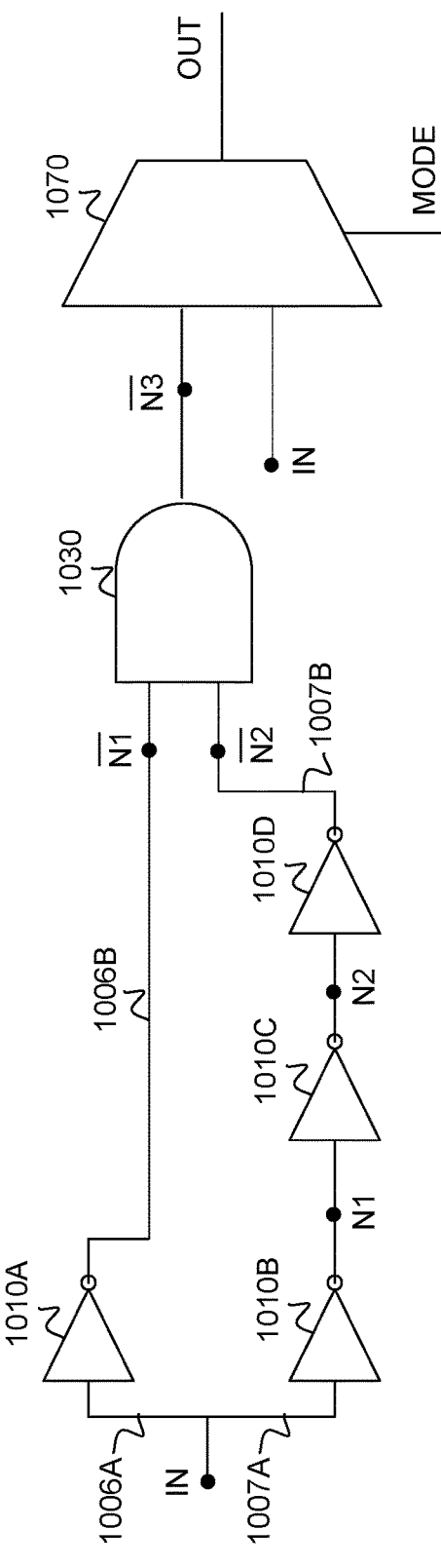

FIG. 10D is an example illustration of an alternative skew-gen circuit 1004, according to one embodiment. The alternative skew gen circuit 1000 can be used to alter the data signal transmitted to pseudo open drain (POD) drivers. POD drivers have a strong pull-up strength and a weaker pull-down strength. To generate the strong pull-down strength, the POD drivers require a longer ON time for pull-down device(s). Thus, POD drivers require a duty cycle with a larger duration (e.g., width) of data low signal and a shorter duration of data high signal. By inverting the data signal observed at node $\overline{N3}$ of FIGS. 10A and 10B, the alternative skew-gen circuit 1004 can generate a data signal with a longer data low duration and shorter data high duration (e.g., a narrow data high pulse).

In one configuration, the alternative skew-gen circuit 1004 includes a two input AND logic gate 1030 instead of the two input NAND logic gate 1031. The output of either the two input AND logic gate 1030 or two input NAND logic gate 1031 is coupled to the input of MUX 1070.

Figure 11:
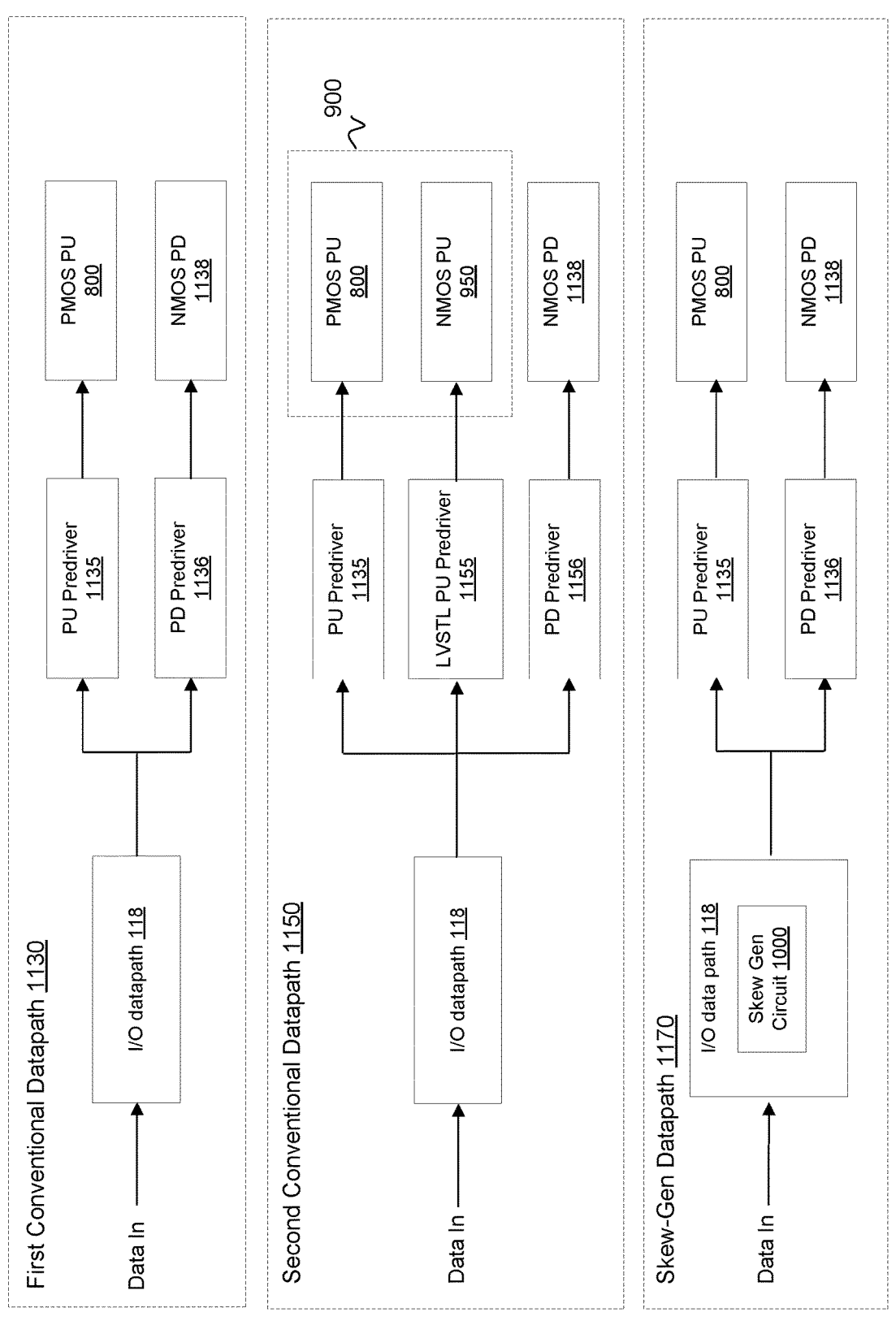
FIG. 11 is an example of a block diagram of a first conventional data path, second conventional data path and a skew-gen data path, according to one embodiment.

FIG. 11 is an example of a block diagram 1100 of a first conventional data path, according to one embodiment. The block diagram 1100 includes a first conventional datapath 1133, a second conventional datapath 1150 and a skew-gen datapath 1170. Each datapath 1133, 1150, 1170 includes a plurality of circuit elements. For example, the first conventional data path 1133 includes a PU predriver 1135, a PD predriver 1136, a PMOS PU 800 and a NMOS PD 1138. The second conventional datapath 1150 includes a PU predriver 1135, a PMOS PU 800, a LVSTL PU predriver 1155, a NMOS PU 950, a PD predriver 1156 and a NMOS PD 1138. The skew-gen datapath 1170 includes the skew-gen circuit 1000, the PU predriver 1135, the PMOS PU 800, the PD Predriver 1136 and the NMOS PD 1138. Each circuit element in the plurality of circuit elements includes a respective input and output configured to receive and send data along a bus. Predriver 1135, predriver 1136 and LVSTL PU predriver 1155 can be configured to provide the necessary integrated charge pump, gate drive and protection capabilities to drive field effect transistor (FET) switches. The PMOS PU driver 800 and NMOS PU driver 950 are configured to alter the signal to logic level high. The NMOS PD driver 1138 is configured to alter the signal to logic level low.

The first conventional datapath 1133 includes a pull-up (PU) Predriver 1135, the PMOS based PU driver 800, a pull-down (PD) Predriver 1136 and a NMOS PD circuit 1138. An I/O bus 118 is coupled to an input of the PU predriver 1135 and an input of the PD predriver 1136. The output of the PU predriver 1135 is coupled to the input of the PMOS based PU driver 800. The output of the PD predriver 1136 is coupled to the input of the NMOS based PD driver 1138.

The second conventional datapath 1150 includes the PU Predriver 1135, the PMOS based PU driver 800, a LVSTL PU Predriver 1155, the NMOS PU driver 950, the PD Predriver 1156 and the NMOS PD driver 1138. The data I/O datapath 118 is coupled to the input of the PU predriver 1135, the input of the LVSTL PU predriver 1155 and the input of the PD predriver 1156. The output of the PU predriver 1135 is coupled to the input of the PMOS PU driver 800. The output of the LVSTL PU predriver 1155 is coupled to the input of the NMOS PU driver 950. The output of the PD predriver 1156 is coupled to the input of the NMOS PD driver 1138. The PU predriver is communicatively coupled to the PMOS based PU driver 800.

The proposed datapath 1170 includes a skew gen circuit 1000, a PU Predriver 1135, a PD Predriver 1136 a PMOS PU 800 and a NMOS PD 1138. The PU predriver is communicatively coupled to the PMOS based PU driver 800. The PD predriver is communicatively coupled to the NMOS PD 1138.

Figure 12A:
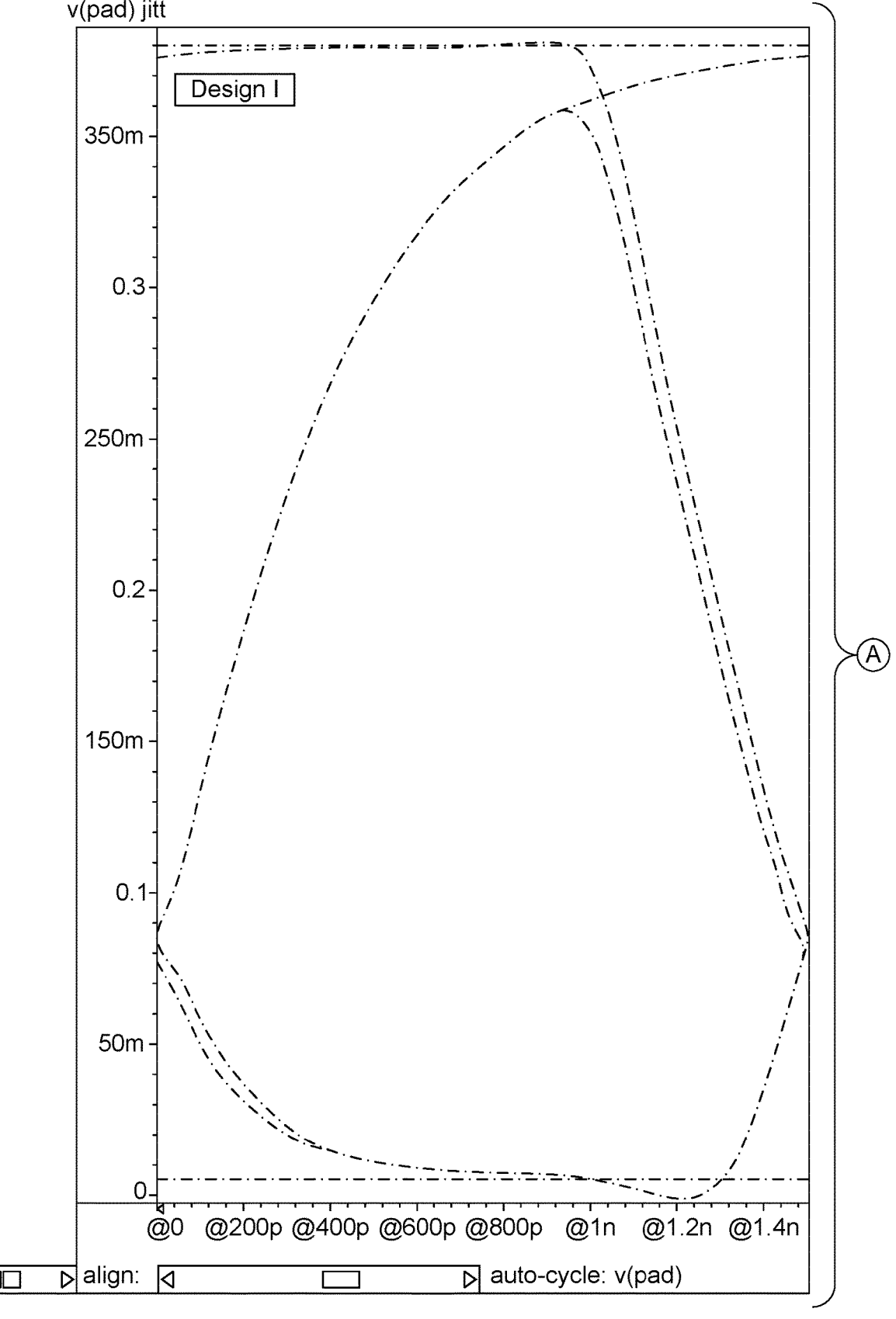
FIG. 12A is an illustration of an eye diagram at an I/O pad for the PMOS based-pull up driver, according to one embodiment.
Figure 12B:
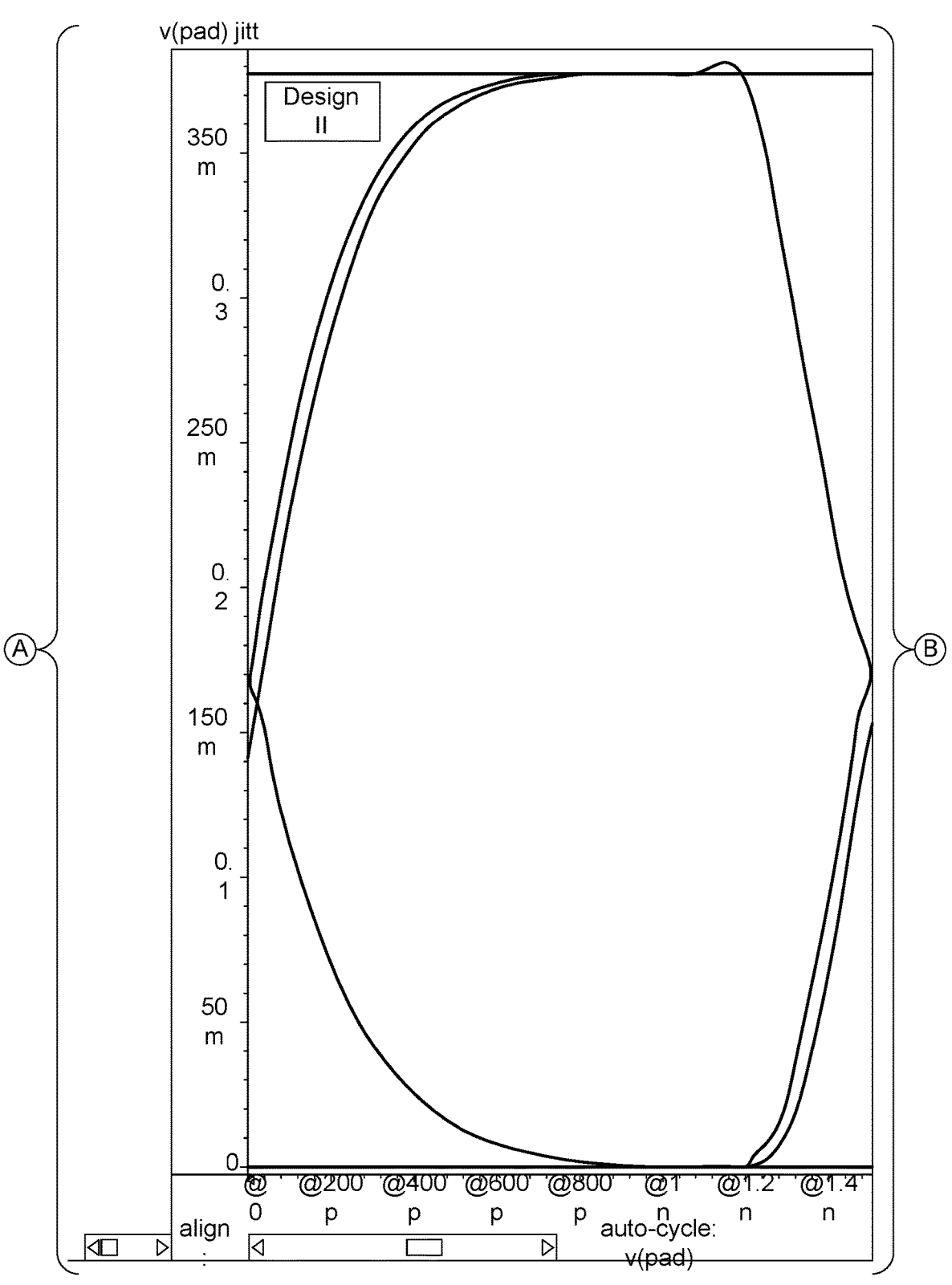
FIG. 12B is an illustration of an eye diagram at an I/O pad for the combination pull-up driver, according to one embodiment.
Figure 12C:
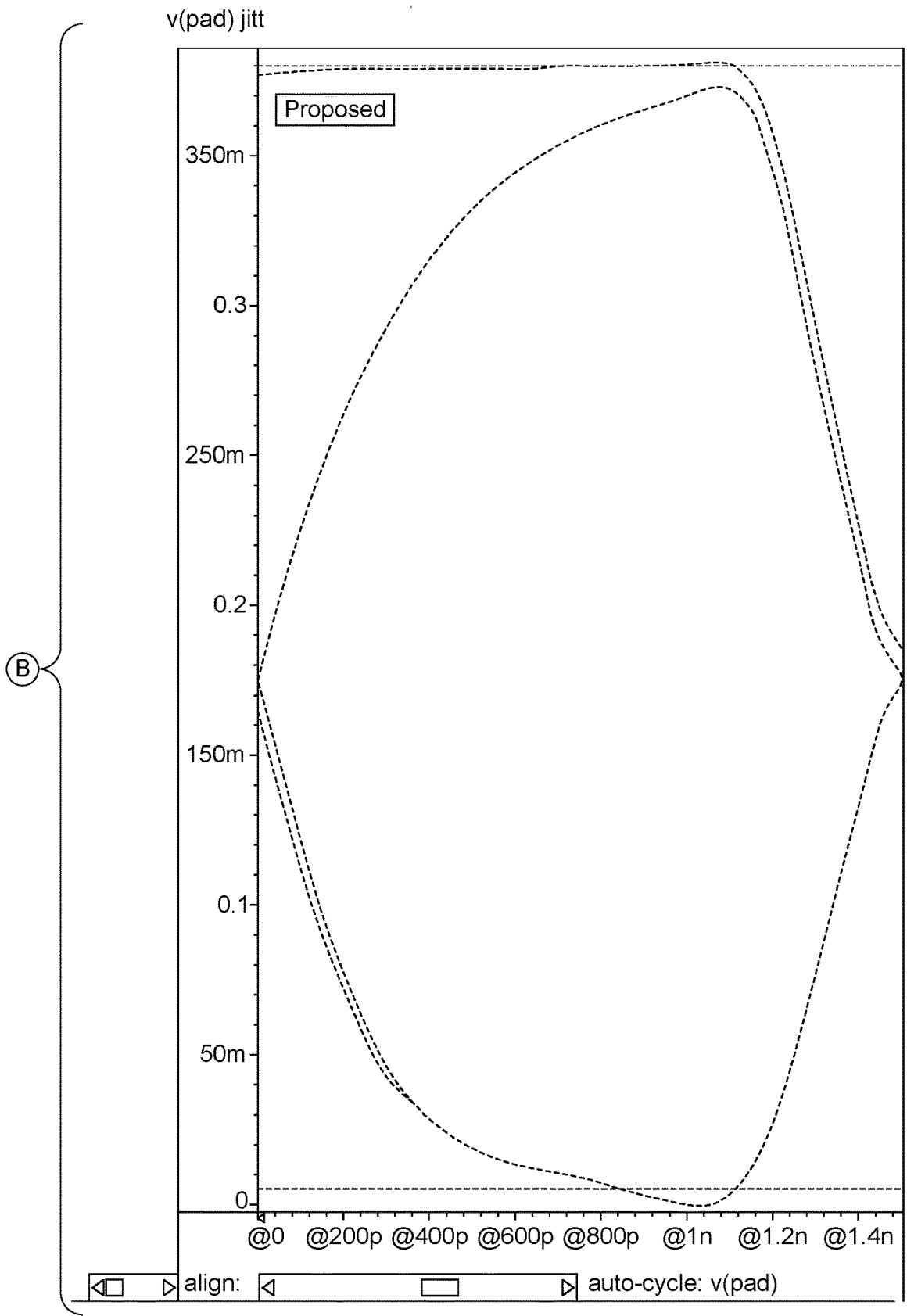
FIG. 12C is an illustration of an eye diagram at an I/O pad for the proposed driver with skew gen circuit, according to one embodiment.

FIGS. 12A-12C illustrate eye diagrams at I/O pat 612 for the PMOS based pull-up driver 800, the combination pull-up driver 900 and the proposed driver with skew gen circuit 1000. FIG. 12A illustrates an eye diagram 1210 at I/O pad 612 for the PMOS based pull-up driver 800. FIG. 12B illustrates an eye diagram 1230 at I/O pad 612 for the combination pull-up driver 900. FIG. 12C illustrates an eye diagram 1250 at I/O pad 612 for the proposed driver with a skew gen circuit 1000.

Each eye diagram 1210, 1230 and 1250 is bounded by a vertical and horizontal axis. The vertical axis includes the v(pad). The horizontal axis includes a UI(unit interval). All of the measurements (jitter, slew rate, etc.,) are measured with respect to the VREFQ level. In one embodiment, measurements are conducted at a minimum VREFQ value of 160 mV to meet ONFI specifications. Measurements of voltage levels other than VREFQ have resulted in performance degradation.

As seen in FIG. 12A for the conventional PMOS based pull-up driver 800, the reference voltage (VREF) is between about 50 mV and 100 mV. As seen in FIG. 12B for the conventional combination PMOS/NMOS pull-up driver 900, the VREFQ is between about 150 mV and 200 mV. As seen in FIG. 12C for the proposed driver with skew gen circuit 1000, the VREFQ is between about 150 mV and 200 mV. ONFI specifications require about 160 mV VREFQ values for normal NAND operation. As seen in FIG. 12A, for the PMOS pull-up-driver 800, a VREFQ between 50 mV and 100 mV is insufficient to meet the ONFI specification requirements. As seen in FIG. 12B for the conventional combination PMOS/NMOS pull-up driver 900, the VREFQ signal of about 170 mV is within ONFI specification requirements, however, the area of the combination PMOS/NMOS pull-up driver 900 circuit is very large as it requires a large amount of hardware which requires a large amount of power and padcap. The conventional combination PMOS/NMOS pull-up driver 900 circuit requires about 32 percent more area compared to the conventional PMOS based pull-up driver 800 circuit. The proposed driver with skew-gen circuit 1000 occupies only about 3 percent more area than the conventional PMOS based pull-up driver 800 circuit.

The proposed driver with skew-gen circuit 1000 incorporates the smaller footprint of the conventional PMOS based pull-up driver 800 with the VREFQ values of the conventional combination PMOS/NMOS pull-up driver 900. Thus, the proposed driver with skew-gen circuit 1000 generates the VREFQ required to meet ONFI specifications while minimizing the footprint.

TABLE 1

| Proposed vs. conventional design results comparison | | | | |
|---|---|---|---|---|
| Parameters | | Design I | Design I (measured at 160 mV Vref) | Design II | Proposed |
| VREF (mv) | MIN | 100 | 160 mV | 170 | 160 |
| | MAX | 160 | | 220 | 210 |
| ABS JITTER (ps) | | 230 | 325 | 68 | 72 |
| DCD (%) | | 5.8 | 10.5 | 1.1 | 0.6 |
| PADCAP (pf) | | 0.924 | | 1.54 | 0.924 |
| LEAKAGE (uA) | | 40.4 | | 54.2 | 40.4 |
| PAD LEAKAGE (uA) | | 17.4 | | 38.1 | 17.4 |

Table 1 illustrates the minimum and maximum VREFQ level, jitter, duty-cycle distortion (DCD), padcap, supply leakage and pad-leakage with drive strength of about 75Ω pull-up, about 37.5Ω pull-down, about 37.5Ω on-die termination (ODT) and about 8 pf load at schematic level for SMIC40 technology among each data path. As seen in table 1, in the conventional PMOS based pull-up driver 900, the minimum VREFQ ONFI specification requirements are violated. Moreover, the ABS jitter is very high (e.g., about 325 ps at 160 mV).

The proposed driver with skew-gen circuit 1000 further offers static and dynamic power reduction in both read operations and write operation. The decreased footprint of the proposed driver with skew-gen circuit 1000 includes a circuit footprint that is smaller than the combination PMOS/ NMOS pull-up driver 900, since the proposed driver does not require the NMOS leg of the PMOS/NMOS pull-up driver 900.

Figure 13:
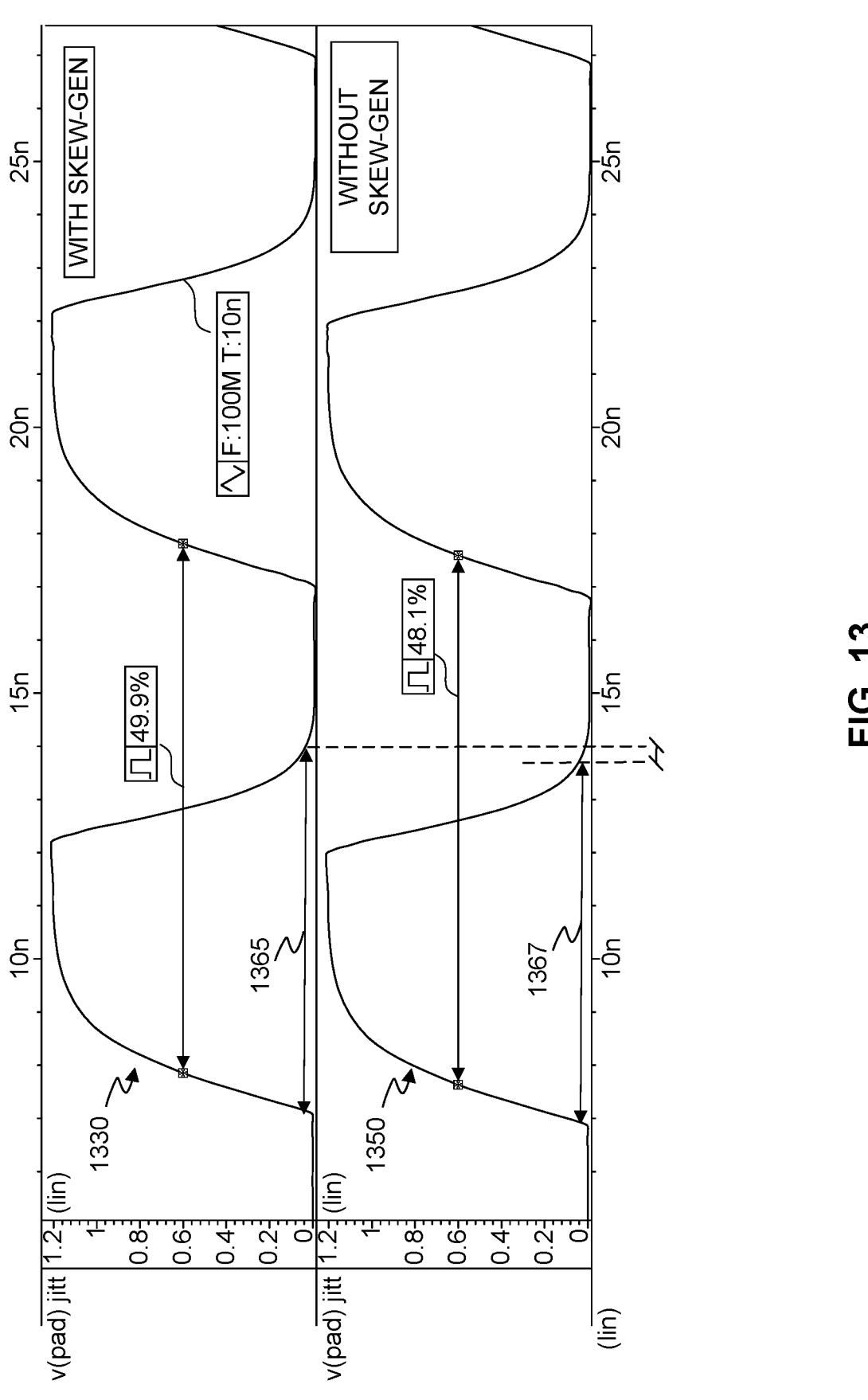
FIG. 13 is an illustration of an example voltage waveform at the I/O pad produced by a conventional PMOS based pull-up driver and the proposed driver with skew gen circuit.

FIG. 13 is an illustration of an example data high signal at the I/O pad produced by a conventional PMOS based pull-up driver, and the proposed driver with skew-gen circuit 900. with and without the skew-gen circuit for a PMOS based pull-up driver, according to one embodiment. The first data high signal 1330 is generated by the proposed driver with skew-gen circuit 900. The second data high signal 1350 is generated by the pull-up based PMOS driver 800.

The first data high signal 1330 includes a first pulse generated over a first duration (e.g., charging time 1365). The first waveform 1330 includes a first pulse width 1365. The second voltage waveform 1350 includes a second pulse generated over a second duration (e.g., charging time 1367). The second voltage waveform 1350 includes a second pulse width 1367. The first data high signal 1330 is observed at the I/O pad 612 with the skew-gen circuit 1000 applied to the first conventional datapath 1130 (e.g., the skew-gen datapath 1170). The second data high signal 1350 is observed at the I/O pad 612 without the skew-gen circuit 1000 (e.g., the first conventional datapath 1130). The skew-gen circuit 1000 is able to "skew" the data high signal to increase the pulse width of the input data high signal. For the purposes of the disclosure herein, the waveform is "skewed" to increase the pulse width.

As seen in FIG. 13, the first data high signal and second data high signal include fast rise times (e.g., a rise time of less than about 5 ns) and fast fall times (a fall time of less than about 5 ns). The first data high signal includes a pulse width of about 49.9% of the duty cycle. The second data high signal includes pulse width of about 48.1% of the duty cycle.

Increasing the pulse duration (e.g., increasing the pulse width) increases the ON time of pull-up devices and decreases the ON time of pull-down devices. In one embodiment, increasing the pulse duration increases the ON time of pull-up predriver 1135 and decreases the ON time of pull-down predriver 1136. By increasing the pulse duration, the skew-gen circuit 1000 can alter/adjust the amount of time that pull-up device and pull-down devices are ON.

I/O operations in NV-LPDDR4 operating mode require an unterminated mode for command and address operations. If the skew-gen circuit 1001 is used in unterminated mode the duty cycle degrades. To avoid degrading the duty cycle, the skew-gen circuit 1001 is bypassed. If the I/O operation is configured to operate in high-speed data transfer without termination and run the I/O operation at low-speed, then there is an observable duty cycle difference in the voltage waveform. For example, in one embodiment, if the I/O operation is run at a low-speed, a duty cycle difference of almost 1.8% (180$p$ at 100 MHZ) can be observed.

Figure 14:
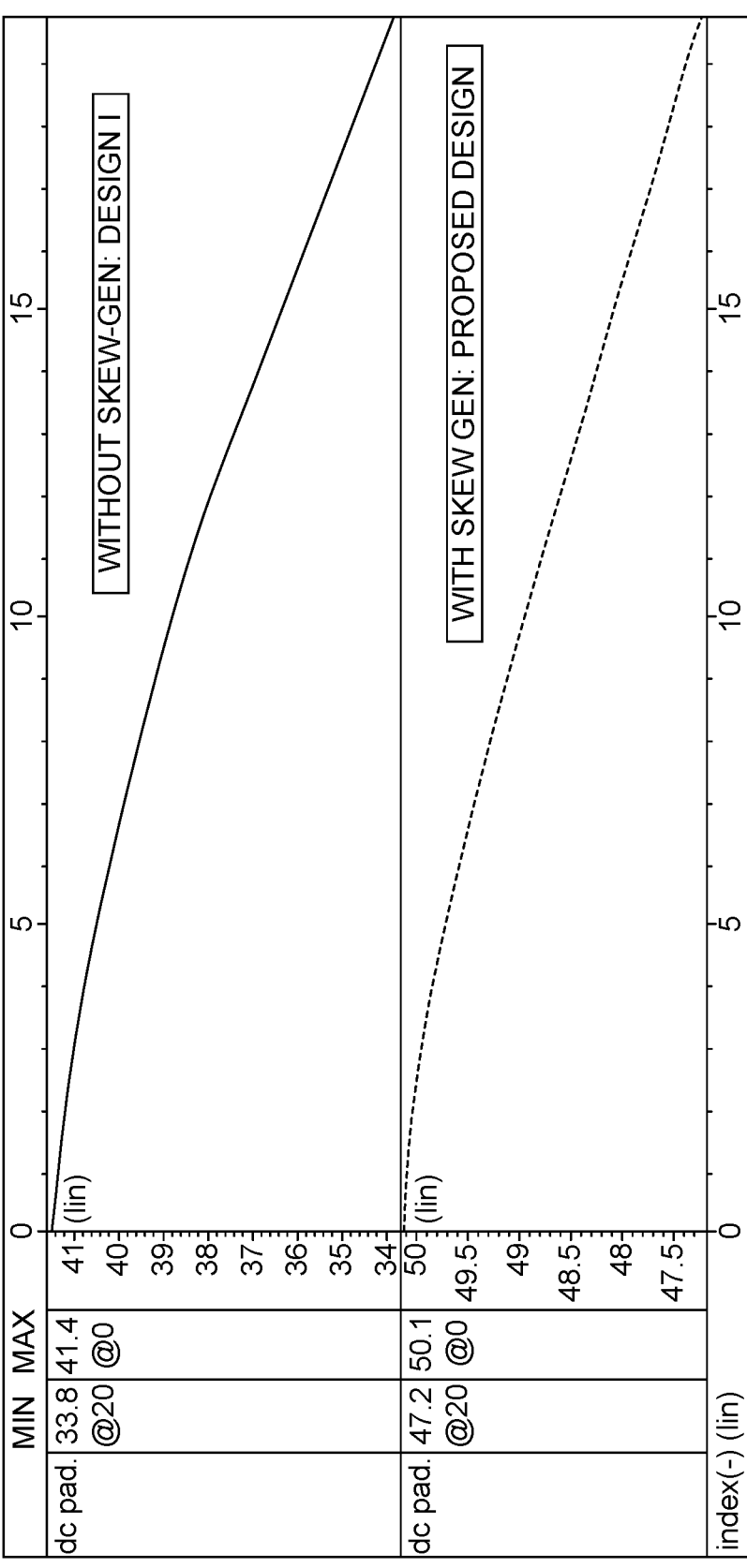
FIG. 14 is an illustration of a first graph and second graph comparing duty cycle distortion (dcd) under load with a skew-gen circuit and without a skew-gen circuit in terminated case at high speed.

FIG. 14 is an illustration of a first graph and second graph comparing duty cycle distortion (dcd) under load with and without a skew-gen circuit 1000 for PMOS based pull-up drivers in terminated case at high speed. The illustration includes a first graph 1404 charting dcd under load with a skew-gen circuit 1000 and a second graph 1406 charting dcd under load without a skew-gen circuit 1000.

As the load is increased from 0p to 20p, the duty cycle of the waveform generated by the PMOS based pull-up driver

800 differs (e.g., is distorted) from the duty cycle of the waveform generated by the proposed driver with skew-gen circuit 1000. For example, in one embodiment, the duty cycle of the waveform generated by the PMOS based pull-up driver 800 differs by about 8% from the duty cycle of the proposed driver with skew-gen circuit 1000. As seen in FIG. 14, the duty cycle of PMOS based pull-up driver 800 measured at VCCQ/6 has a minimum value of 33.8 at 20p and a maximum value of 41.4 at 20p. In comparison, the duty cycle of the proposed driver with skew-gen circuit 1000 measured at VCCQ/6 has a minimum value of 47.2 at 20p and a maximum value of 50.1 at 20p.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A system for altering an input/output (I/O) data signal of a NAND programming operation, the system comprising:
   a skew-gen circuit comprising:
      a delay block coupled to an input of a two input logic OR gate, and a MUX logic gate coupled to an output of the logic OR gate and connected to a subsequent datapath, the skew-gen circuit configured to:
         alter a pulse width of a input data signal by increasing the width of a data high signal and decreasing a width of a data low signal; and
         output the altered data signal to the MUX, the MUX configured to select either the altered data signal or the input data signal depending on a NAND programming operation mode and provide an output to the subsequent datapath, the subsequent datapath coupling a pull-up predriver and pull-down predriver.

2. The system of claim 1, wherein the pull-up predriver is coupled to a PMOS based pull-up driver and the pull-down predriver is coupled to a NMOS based pull-down driver.

3. The system of claim 1, wherein the skew-gen circuit is used as an I/O that supports both LVSTL and CTT signaling.

4. The system of claim 3, wherein the LVSTL is used for NV-LPDDR4 operation and CTT signaling is used for NV-DDR3 operation.

5. The system of claim 3, wherein the LVSTL is used for LPDDR4 operation and CTT signaling is used for DDR3 operation.

6. The system of claim 1, wherein the skew-gen circuit outputs a non-altered input data signal in LVSTL signaling mode where output requirements are met by the non-altered input data signal.

7. A system for altering an input/output (I/O) data signal of a NAND programming operation, the system comprising:
   a skew-gen circuit that supports both pseudo open drain (POD) and CTT signaling comprising: a delay block coupled to an input of a two input logic AND gate, and a MUX logic gate coupled to an output of the logic AND gate, the skew-gen circuit configured to:
      alter a pulse width of a input data signal by decreasing a width of a data high signal and increasing a width of a data low signal; and
      output the altered data signal to the MUX, the MUX configured to select either the altered data signal or the input data signal depending on a NAND programming operation mode.

8. The system of claim 7, wherein an output of the MUX is connected to a subsequent datapath, the subsequent datapath coupling a pull-up predriver and pull-down predriver.

9. The system of claim 8, wherein the pull-up predriver is coupled to a PMOS based pull-up driver and the pull-down predriver is coupled to a NMOS based pull-down driver.

10. The system of claim 9, wherein POD signaling is used for DDR4 operation and CTT signaling is used for DDR3 operation.

11. A system for altering an input/output (I/O) data signal of a NAND programming operation, the system comprising:
   a skew-gen circuit comprising: a delay block coupled to an input of a programmable logic gate, the programmable logic gate programmable as either a logic AND gate for POD signaling or logic OR gate for LVSTL operation based on a control input applied to the skew-gen circuit, and a MUX logic gate coupled to an output of the programmable logic gate, the skew-gen circuit configured to:
      alter a pulse width of a input data signal by increasing or decreasing a width of a data high signal and decreasing or increasing a width of s data low signal based on the control input applied to the skew-gen circuit; and
      output an altered data signal to the MUX, the MUX configured to select either the altered data signal or the input data signal depending on a NAND programming operation mode.

12. The system of claim 11, wherein a non-altered input data signal is passed through the MUX as an output of the MUX, the non-altered input data signal being used for CTT signaling.

13. The system of claim 11, wherein an output of the MUX is connected to a subsequent datapath, the subsequent datapath coupling a pull-up predriver and pull-down predriver.

14. The system of claim 13, wherein increasing the pulse width of the data signal increases the on time of the pull-up predriver.

15. The system of claim 13, wherein decreasing the pulse width of the data signal increases the on time of the pull-down predriver.

16. The system of claim 11, wherein a pull-up predriver is coupled to a PMOS based pull-up driver and a pull-down predriver is coupled to a NMOS based pull-down driver.

17. The system of claim 11, wherein the skew-gen circuit outputs a non-altered input data signal in POD and LVSTL signaling modes where output requirements are met by the non-altered input data signal.

*     *     *     *     *